(12) United States Patent
Tamaki et al.

(10) Patent No.: US 9,814,284 B2
(45) Date of Patent: Nov. 14, 2017

(54) DISPLAY DEVICE, DRIVING METHOD OF DISPLAY DEVICE, PROGRAM, AND MEMORY MEDIUM

(71) Applicant: SEMICONDUCTOR ENERGY LABORATORY CO., LTD., Atsugi-shi, Kanagawa-ken (JP)

(72) Inventors: Shigeru Tamaki, Kanagawa (JP); Tadaaki Maekoya, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 58 days.

(21) Appl. No.: 14/484,790

(22) Filed: Sep. 12, 2014

(65) Prior Publication Data
US 2015/0077438 A1    Mar. 19, 2015

(30) Foreign Application Priority Data

Sep. 18, 2013 (JP) ................................. 2013-193377

(51) Int. Cl.
| | |
|---|---|
| G09G 5/12 | (2006.01) |
| A44C 5/00 | (2006.01) |
| G06T 3/00 | (2006.01) |
| G04C 3/00 | (2006.01) |
| G06F 1/16 | (2006.01) |
| G06F 3/03 | (2006.01) |
| G06F 3/041 | (2006.01) |
| G06F 3/0481 | (2013.01) |
| G06F 3/0485 | (2013.01) |
| H01L 51/50 | (2006.01) |

(52) U.S. Cl.
CPC ................ *A44C 5/00* (2013.01); *G04C 3/002* (2013.01); *G06F 1/163* (2013.01); *G06F 1/1643* (2013.01); *G06F 1/1652* (2013.01); *G06F 1/1694* (2013.01); *G06F 3/0304* (2013.01); *G06F 3/041* (2013.01); *G06F 3/0481* (2013.01); *G06F 3/0485* (2013.01); *G06F 3/04817* (2013.01); *G06T 3/00* (2013.01); *H01L 51/5012* (2013.01); *G06F 2203/04102* (2013.01); *G06F 2203/04103* (2013.01)

(58) Field of Classification Search
CPC .......................................................... A44C 5/00
USPC .......................................................... 345/672
See application file for complete search history.

(56) References Cited

U.S. PATENT DOCUMENTS

| | | |
|---|---|---|
| 6,597,384 B1 | 7/2003 | Harrison |
| 8,319,725 B2 | 11/2012 | Okamoto et al. |
| 8,367,440 B2 | 2/2013 | Takayama et al. |
| 8,415,208 B2 | 4/2013 | Takayama et al. |
| 8,427,420 B2 | 4/2013 | Yamazaki et al. |
| 2002/0034930 A1 | 3/2002 | Yamazaki et al. |

(Continued)

*Primary Examiner* — Javid A Amini
(74) *Attorney, Agent, or Firm* — Fish & Richardson P.C.

(57) ABSTRACT

A display position of an image is moved in accordance with positional information of a display device having a curved display surface. Displacement of a display device is sensed by a camera portion and an acceleration sensor, and the display position is determined in accordance with the displacement, so that the image is displayed in the display position. In the case where the display device rotates and the like, a desired piece of information can be displayed automatically in a display region that can be easily seen.

18 Claims, 15 Drawing Sheets

(56) References Cited

U.S. PATENT DOCUMENTS

| | | | |
|---|---|---|---|
| 2004/0008191 A1* | 1/2004 | Poupyrev | G06F 3/011 |
| | | | 345/184 |
| 2009/0002328 A1* | 1/2009 | Ullrich | G06F 3/016 |
| | | | 345/173 |
| 2009/0071952 A1 | 3/2009 | Kuwabara | |
| 2010/0029327 A1* | 2/2010 | Jee | G04G 17/045 |
| | | | 455/556.1 |
| 2010/0239907 A1 | 9/2010 | Izumi | |
| 2011/0187681 A1* | 8/2011 | Kim | G06F 1/1652 |
| | | | 345/204 |
| 2011/0227822 A1* | 9/2011 | Shai | G06F 1/1615 |
| | | | 345/156 |
| 2011/0233384 A1* | 9/2011 | Wu | B60J 3/04 |
| | | | 250/208.2 |
| 2012/0162214 A1* | 6/2012 | Chavez | G06F 3/012 |
| | | | 345/419 |
| 2013/0005443 A1* | 1/2013 | Kosta | G07F 17/3206 |
| | | | 463/25 |
| 2013/0044215 A1* | 2/2013 | Rothkopf | G06F 1/163 |
| | | | 348/143 |
| 2013/0076612 A1* | 3/2013 | Myers | G06F 1/1626 |
| | | | 345/156 |
| 2013/0137483 A1* | 5/2013 | Senoo | G09G 5/00 |
| | | | 455/556.1 |
| 2013/0181955 A1 | 7/2013 | Okamoto et al. | |
| 2013/0214324 A1 | 8/2013 | Takayama et al. | |
| 2013/0224562 A1 | 8/2013 | Momo | |
| 2013/0300732 A1* | 11/2013 | Hosoya | G06F 1/1652 |
| | | | 345/419 |
| 2013/0314346 A1 | 11/2013 | Yamazaki et al. | |
| 2014/0333735 A1* | 11/2014 | Bathiche | H04N 13/0404 |
| | | | 348/54 |

* cited by examiner

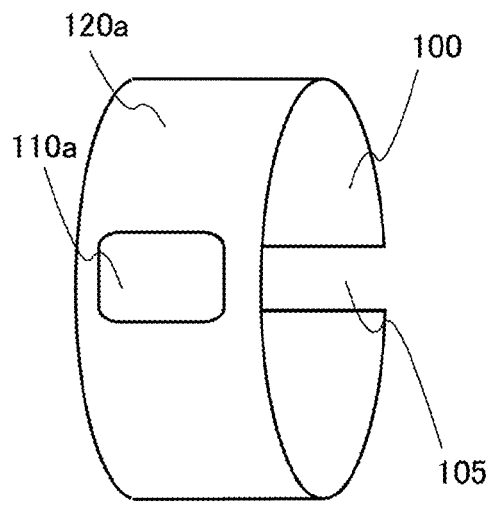
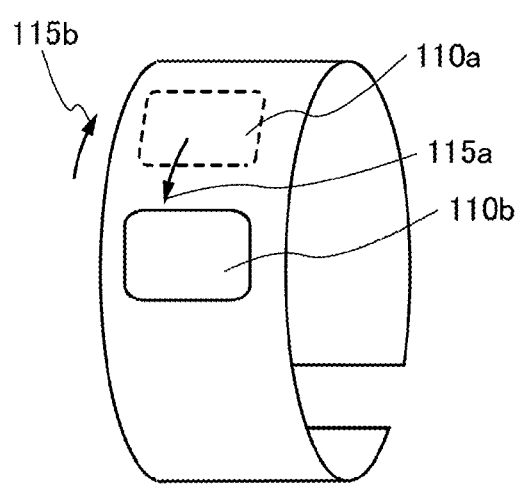
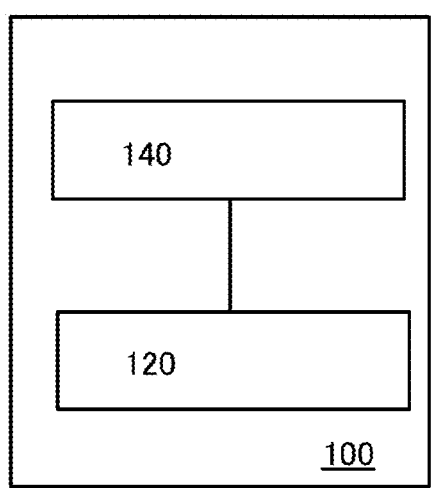
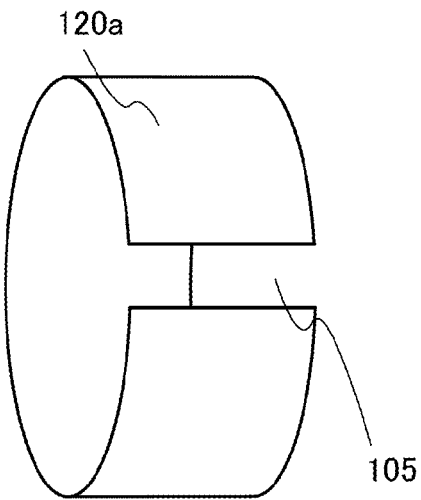

FIG. 8A    FIG. 8B    FIG. 8C
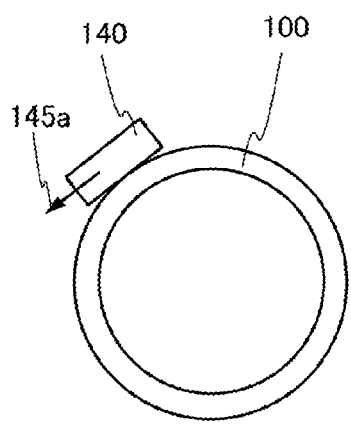 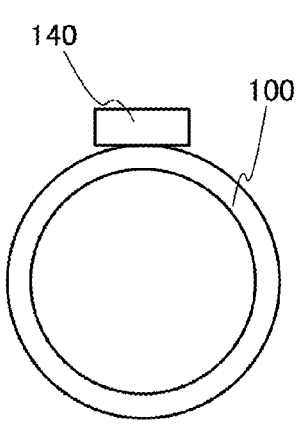 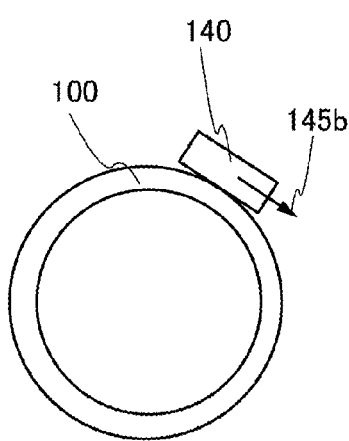
FIG. 8D
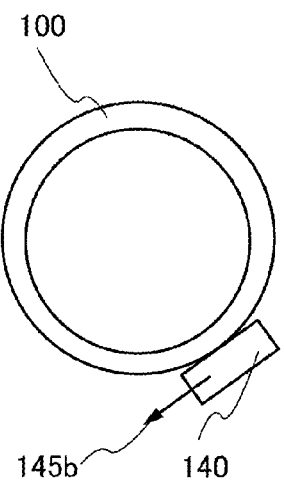

DISPLAY DEVICE, DRIVING METHOD OF DISPLAY DEVICE, PROGRAM, AND MEMORY MEDIUM

BACKGROUND OF THE INVENTION

1. Field of the Invention

The present invention relates to an object, a method, or a manufacturing method. In addition, the present invention relates to a process, a machine, manufacture, or a composition of matter. In particular, the present invention relates to, for example, a semiconductor device, a display device, a light-emitting device, a power storage device, a driving method thereof, or a manufacturing method thereof. In particular, the present invention relates to a display device, a driving method of the display device, a program, and a memory medium.

In this specification, a display device includes a light-emitting device and a liquid crystal display device in its category.

2. Description of the Related Art

In recent years, display of a portable information terminal has been desired to be easy to see.

A mobile terminal of which the displaying direction is changed is disclosed in Patent Document 1.

A flexible display is disclosed in Patent Document 2.

PATENT DOCUMENT

[Patent Document 1] United States Patent Application Publication No. 2013/0137483

[Patent Document 2] United States Patent Application Publication No. 2013/0044215

SUMMARY OF THE INVENTION

A display device having a curved display surface, such as a ring-shaped display device, can display a variety of information. However, in the case where the information is arranged along the circumference of a circle, there are a display position that can be easily seen and a display position that cannot be easily seen. That is, while a piece of information displayed on a display region at the front can be easily seen, a piece of information displayed on a display region at the sides cannot be easily seen and a piece of information displayed on a display region on the outer peripheral surface on the opposite side can hardly be seen.

Taking a wristwatch having a curved display surface as an example of the display device, as the wristwatch rotates in a circumferential direction with twist of a wrist wearing the wristwatch, the relative position of the information displayed on a display region with respect to an eye changes; therefore, desired information may not appear at the intended position. Similar problems may occur when a display device other than a wristwatch rotates.

A ring-shaped display device which displays a desired piece of information on a display region that can be easily seen, a driving method of the display device, and a program thereof are provided. Alternatively, a novel display device is provided. Alternatively a novel driving method of a display device is provided. Note that the descriptions of these objects do not disturb the existence of other objects. In one embodiment of the present invention, there is no need to achieve all the objects. Other objects will be apparent from and can be derived from the description of the specification, the drawings, the claims, and the like.

One embodiment of the present invention is a ring-shaped display device including a sensing unit that senses positional information of the display device and a display portion that displays an image on a display position determined in accordance with the positional information.

The sensing unit may include an acceleration sensor.

The positional information of the display device may include rotational positional information based on rotation in a circumferential direction of the display device.

The display position may be configured to move in a direction opposite to the direction of rotation in the circumferential direction.

When the radius of the display device is r and the angle of rotation in the circumferential direction of the display device is $\theta$ radian, the display position may be configured to move, in a direction opposite to the circumferential direction, a length of $r\theta$ (product of the angle and the radius).

A display surface of the display portion may exist in a range of larger than 180° and smaller than or equal to 360° along the circumferential direction of the display device.

The display device may be a wearable display device.

One embodiment of the present invention is a driving method of a display device that senses displacement of a ring-shaped display device, determines a display position in accordance with the displacement, and displays an image in the display position.

The displacement may be sensed by an acceleration sensor.

The displacement may include rotational displacement based on rotation in a circumferential direction of the display device.

The display position may be configured to move in a direction opposite to the direction of rotation in a circumferential direction of the display device, from the display position before the display device rotates.

When the radius of the display device is r and the angle of rotation in the circumferential direction of the display device is $\theta$ radian, the display position may be configured to move, in a direction opposite to the circumferential direction, a length of $r\theta$ (product of the angle and the radius).

A display surface to display the image may exist in a range of larger than 180° and smaller than or equal to 360° along the circumferential direction of the display device.

One embodiment of the present invention is a program that includes an instruction to sense displacement of a display device and an instruction to move a display position of an image in accordance with the displacement.

The displacement may be sensed by an acceleration sensor.

The displacement may include rotational displacement based on rotation in a circumferential direction of the display device.

The display position may be configured to move in a direction opposite to the direction of rotation in the circumferential direction.

When the radius of the display device is r and the angle of rotation in the circumferential direction of the display device is $\theta$ radian, the display position may be configured to move, in a direction opposite to the circumferential direction, a length of $r\theta$ (product of the angle and the radius).

A display surface to display the image may exist in a range of larger than 180° and smaller than or equal to 360° along the circumferential direction of the display device.

One embodiment of the present invention is a display device that senses positional information of the display device (up and down direction of the display device, angle and direction of rotation of the display device, and the like)

once a display position of desired information is set, allows the desired information to move over a display surface so as to keep the inclination of the set display position with respect to the vertical direction constant even when the display device rotates in a circumferential direction around an arm or the like as an axis, and as a result fixes the display position with respect to a user's eye in the circumferential direction; a driving method of the display device, and a program thereof.

One embodiment of the present invention is a computer-readable memory medium that stores the above program.

In the case where a display device rotates and the like, a desired piece of information can be automatically displayed in a display region that can be easily seen. A novel display device or the like can be provided. Other effects will be described in embodiments and the like. Note that the description of these effects does not disturb the existence of other effects. One embodiment of the present invention does not necessarily achieve all the objects listed above. Other effects will be apparent from and can be derived from the description of the specification, the drawings, the claims, and the like.

BRIEF DESCRIPTION OF THE DRAWINGS

In the accompanying drawings:

FIGS. 1A to 1D are perspective views and a block diagram showing one embodiment of the present invention;

FIGS. 8A to 8D are cross-sectional views showing one embodiment of the present invention;

DETAILED DESCRIPTION OF THE INVENTION

Figure 2A:
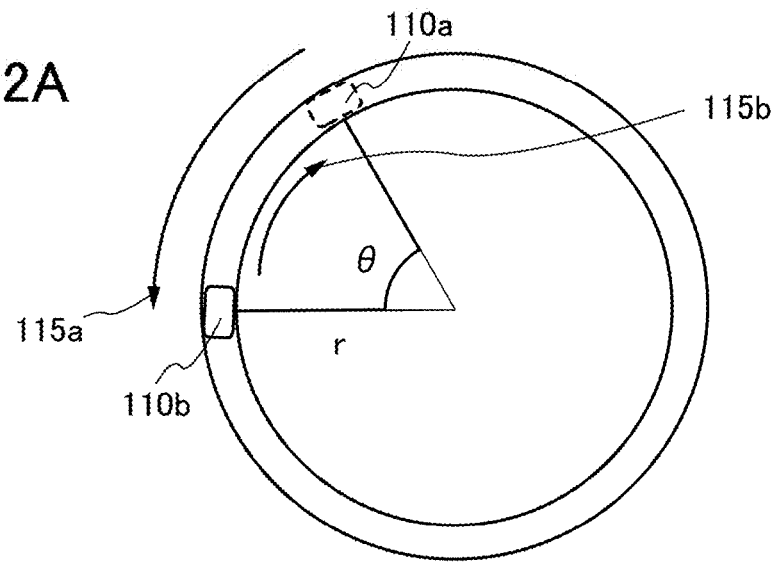
FIGS. 2A to 2C are cross-sectional views showing one embodiment of the present invention.

Embodiments of the present invention will be described below in detail with reference to the drawings. However, the present invention is not limited to the description below, and it is easily understood by those skilled in the art that modes and details disclosed herein can be modified in various ways. Therefore, the present invention is not necessarily construed as being limited to description of the embodiments.

(Embodiment 1)

One embodiment of a display device, a driving method of the display device, and a program thereof will be described with reference to FIGS. 1A to 1D. The display device described in this embodiment is, for example, a light-emitting device or a liquid crystal display device. The light-emitting device includes an organic electroluminescence element, for example.

As shown in FIG. 1C, a display device 100 includes a display portion 120 and a sensing unit 140. The display portion 120 includes a display surface 120a shown in FIG. 1A, for example. The display surface 120a can display an image 110a.

The shape of the display device 100 is a circle made by bending a band-like object, for example. Furthermore, the display device 100 is at least partly flexible and has a gap 105, for example. Thus, a user can wear the display device 100 on his/her wrist by widening the gap 105. The user can wear the display device 100 not only on his/her wrist but also around his/her neck, ankle, or the like. In addition, the display device 100 can be put on a columnar object such as a pipe or a pole, in addition to a wrist, a neck, or an ankle. The cross-sectional shape of the columnar object is, for example, a circle or a polygon, but is not necessarily limited thereto. The display device 100 can be put on an object other than the columnar object.

Although the display device 100 shown in FIG. 1A has the gap 105, the display device 100 need not necessarily have the gap 105. In other words, the display device 100 can be a band-like object curving and continued without a gap. Furthermore, the shape of the display device 100 can be a structure that is generally used for a wristwatch.

The display device 100 is a ring-shaped display device, for example. The ring-shaped display device is a hollow columnar display device, for example. The cross-sectional shape of the display device 100 is any of those shown in FIGS. 2A to 2C, for example. The shape of the ring-shaped display device can be a ring without a gap, or a ring having a gap as shown in FIG. 1A.

The display surface 120a is not limited to the front face as shown in FIG. 1A but may extend to the outer peripheral surface on the opposite side as shown in FIG. 1D. The display surface 120a can exist in a range of larger than 180° and smaller than 360° along a circumferential direction of the display device 100, for example. The display surface 120a can exist in a range of 360° along the circumferential direction of the display device 100, for example. The display surface 120a can exist on the entire surface along the circumferential direction of the display device 100, for example. The display surface 120a can exist in an angular range larger than the viewing angle of the display device 100 along the circumferential direction of the display device 100, for example.

The display surface 120a can display the image 110a. The image 110a to be displayed may be an object such as a clock, weather, temperature, humidity, stock prices, or exchange rates, for example. The object may be an icon or a widget. The display surface 120a can display a wallpaper in addition to the object. The display surface 120a can display an operational button in addition to the object. The operational button is, for example, a button having a function of returning to the previous screen, a button having a function of displaying a home screen, or a keyboard. Alternatively, the wallpaper or the operational button can be displayed instead of the object.

The image 110a can be a still image or a moving image.

The sensing unit 140 senses positional information of the display device 100. The positional information of the display device 100 may include rotational positional information of the display device 100. The rotational positional information of the display device 100 may include the direction, the angle or the like of rotation of the display device 100, for example. The angle of rotation of the display device 100 can be a difference between the inclination of the display device 100 before rotating (e.g., the inclination of the display device 100 in the state of FIG. 1A) and the inclination of the display device 100 after rotating (e.g., the inclination of the display device 100 in the state of FIG. 1B). The reference of the inclination of the display device 100 (that is, the position at which the inclination of the display device is 0°) can be arbitrarily determined. Inclination of the display device 100 will be described later with reference to FIGS. 8A to 8D or the like.

The direction of rotation of the display device 100 includes a circumferential direction such as an arrow 115a and an arrow 115b in FIG. 1B, for example. The direction of the arrow 115a is opposite to the direction of the arrow 115b. The direction of rotation of the display device 100 may include a direction perpendicular to the circumferential direction such as the arrow 115a and the arrow 115b in FIG. 1B, for example. The rotational positional information of the display device 100 can include the rotation speed (that is, angular velocity) of the display device 100.

The sensing unit 140 senses the inclination of the display device, for example.

Positional information of the display device 100 based on the inclination of the display device 100 with respect to the vertical direction can be sensed with the use of the sensing unit 140. The vertical direction is the direction of the gravity. The vertical direction can be expressed as the direction indicated by a plumb line. Inclination of the display device 100 with respect to the vertical direction can be defined as an angle formed by the following two line segments: a line segment connecting a certain point of the display device 100 and the center point of rotation of the display device 100; and a line segment connecting one of the points where the vertical line passing through the center point intersects the display device 100 and the center point.

The sensing unit 140 is, for example, an acceleration sensor or a gyroscope sensor.

The acceleration sensor is, for example, a biaxial acceleration sensor or a triaxial acceleration sensor.

A uniaxial acceleration sensor can also be used as the acceleration sensor.

The provision of a plurality of the acceleration sensors enables a structure sensing positional information.

The sensing unit 140 may be a sensor that senses an inclination, other than the acceleration sensor or the gyroscope sensor.

In the case where the acceleration sensor is used as the sensing unit 140, for example, the inclination of a device provided with the sensing unit 140 can be sensed. The acceleration sensor can sense the inclination of the device by sensing the gravitational acceleration.

For example, when the acceleration sensor is provided on a substrate and the substrate is kept in a horizontal position, the acceleration sensor is subjected to gravity corresponding to +1 g (g is gravitational acceleration) in the downward direction (the direction of gravitational acceleration), that is, the acceleration sensor senses an acceleration of +1 g (g is gravitational acceleration) in the Z-axis direction.

When the substrate is inclined at 90° in an arbitrary direction, the acceleration sensor senses an acceleration of 0 g (g is gravitational acceleration) in the Z-axis direction. When the substrate is turned upside down (i.e., when the acceleration sensor is on the underside of the substrate while the substrate is kept in a horizontal position), the acceleration sensor senses an acceleration of −1 g (g is gravitational acceleration) in the Z-axis direction.

The acceleration sensor can senses acceleration in the X-axis direction, in a manner similar to the above. For example, when the substrate is kept in a horizontal position, the acceleration sensor senses an acceleration of 0 g (g is gravitational acceleration) in the X-axis direction. When the substrate is inclined at 90° around the Y-axis of the acceleration sensor as the rotation axis (i.e., the substrate is inclined at 90° while keeping the state where the acceleration sensor senses an acceleration of 0 g (g is gravitational acceleration) in the Y-axis direction), the acceleration sensor senses an acceleration of +1 g (g is gravitational acceleration) or −1 g (g is gravitational acceleration) in the X-axis direction. For example, the following definition can be given: when the acceleration sensor senses a positive acceleration in the X-axis direction, the display device 100 rotates in the positive direction, and when the acceleration sensor senses a negative acceleration in the X-axis direction, the display device 100 rotates in the negative direction.

FIGS. 8A to 8D each show a cross-sectional view of the display device 100 provided with the sensing unit 140. In FIG. 8B, the right side of the sensing unit (here, the acceleration sensor) 140 is the positive direction of the X-axis of the acceleration sensor and the left side is the negative direction of the X-axis of the acceleration sensor, for example. When the display device 100 rotates from the state of FIG. 8B to the state of FIG. 8A, the angle of inclination of the display device 100 in FIG. 8A is θ (θ is greater than or equal to −90° and less than 0°), setting the state of FIG. 8B as a reference. At this tune, the acceleration sensor senses a negative acceleration of g·sin θ (arrow 145a) in the X-axis direction, which can be defined as rotation of the display device 100 in the negative direction.

When the display device 100 rotates from the state of FIG. 8B to the state of FIG. 8C, the angle of inclination of the display device 100 in FIG. 8C is θ (θ is greater than 0° and less than or equal to 90°), setting the state of FIG. 8B as a reference. At this time, the acceleration sensor senses a positive acceleration of g·sin θ (arrow 145b) in the X-axis direction, which can be defined as rotation of the display device 100 in the positive direction.

The acceleration sensor can sense acceleration in the Y-axis direction in a manner similar to the above.

When the display device 100 is in the state shown in FIG. 8D (for example, in the state where θ is greater than 90° and less than or equal to 180°), the acceleration sensor senses a positive acceleration g·sin θ (θ is greater than 90° and less than or equal to 180°) in the X-axis direction. Then, it may become difficult to distinguish the state of FIG. 8D from the state of FIG. 8C. However, in this case, the state of FIG. 8D can be distinguished from the state of FIG. 8C when the sensing result in the Z-axis direction of the acceleration sensor is also taken into consideration. This is because the acceleration sensor senses a positive acceleration in the Z-axis direction in the state of FIG. 8C and senses a negative acceleration in the Z-axis direction in the state of FIG. 8D, for example.

Thus, providing the display device 100 with the acceleration sensor enables sensing of the inclination of the display device 100. As a reference of the inclination of the display device 100, the state of FIG. 8B may be set as a state where the inclination of the display device 100 is at an angle of 0°, for example.

A change in acceleration corresponding to an inclination of a display device is small at an inclination in the vicinity of 90° or −90°, because an acceleration corresponding to an inclination of a display device is expressed using trigonometric function. Accordingly, the sensitivity of the acceleration sensor is lowered at an inclination in the vicinity of 90° or −90°. A plurality of acceleration sensors are arranged in different positions of the display device 100 (for example, a plurality of acceleration sensors are arranged in different positions of the display device 100 so as to sense different accelerations), whereby it is possible to prevent all the acceleration sensors from simultaneously sensing acceleration at an inclination in the vicinity of 90° or −90°, and the inclination of the display device 100 can be sensed accurately.

The positional information may include geographical positional information. Geographical positional information is, for example, positional information expressed by coordinates of longitude and latitude. The geographical positional information may further include coordinate in the height direction. In that case, the sensing unit 140 needs to be able to sense geographical positional information. In order to sense geographical positional information, a satellite positioning system, specifically, a global positioning system (GPS) may be utilized, for example.

FIG. 1A shows the display device 100 before rotating in a circumferential direction. FIG. 1B shows the display device 100 after rotating in a circumferential direction (the direction of the arrow 115b). In the case where the display position of the image 110a is fixed with respect to the display device 100, when the display device 100 rotates in a circumferential direction (the direction of the arrow 115b) (for example, in the case where the display device 100 is used as a wristwatch, when the wristwatch rotates in the direction of the arrow 115b around a user's arm as an axis), the display position of the image 110a moves in the direction of the arrow 115b relatively with respect to the user's eye. In FIG. 1B, for example, the image 110a moves from the front face to the upper portion of the display surface 120a, whereby it may become difficult to see the image 110a. When the display device 100 further rotates in the direction of the arrow 115b from the state of FIG. 1B, the image 110a moves to the outer peripheral surface on the opposite side of the display surface 120a, and can hardly be seen.

The display device 100 having a ring-like shape includes the sensing unit 140 that senses positional information of the display device, and the display portion 120 that displays an image in a display position determined in accordance with the positional information. With this structure, the image can be moved to a position which can be easily seen even when the display device 100 is moved. Preferably, the image can be displayed in a position where the image can be seen in the same way as before the display device 100 is moved.

The positional information of the display device 100 may include rotational positional information based on rotation in a circumferential direction of the display device 100. At this time, the display position of an image may be configured to move in a direction opposite to the direction of rotation in a circumferential direction of the display device 100. For example, when the display device 100 rotates in the direction of the arrow 115b, the display position of the image can be moved in the direction of the arrow 115a on the display surface 120a. In this way, even when the display device 100 rotates, the image can be moved to the position easily seen.

Preferably, the image 110a moves to become an image 110b as shown in FIG. 1B, and the image can be displayed in a position where the image can be seen in the same way as before the display device 100 rotates in a circumferential direction.

In addition, since the display position of the image moves on the display surface 120a, burn-in of the display portion 120 having a display element such as a liquid crystal element or an EL element can be suppressed. Furthermore, the lifetime of the display device 100 can be extended.

Since burn-in of the display portion 120 can be suppressed even when the display device 100 is not provided with a mechanism for suppressing burn-in, such as a screen saver, the display device 100 can have a more simplified structure.

The sensing unit 140 can be a unit for sensing displacement of the display device 100. In that case, a driving method of the display device can include a step of sensing displacement of the ring-shaped display device, a step of determining a display position in accordance with the displacement, and a step of displaying an image in the display position. The driving method can be controlled by a program.

Figure 2B:
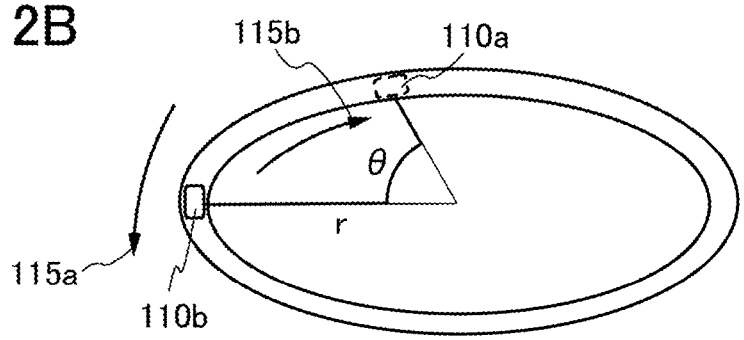
Figure 2C:
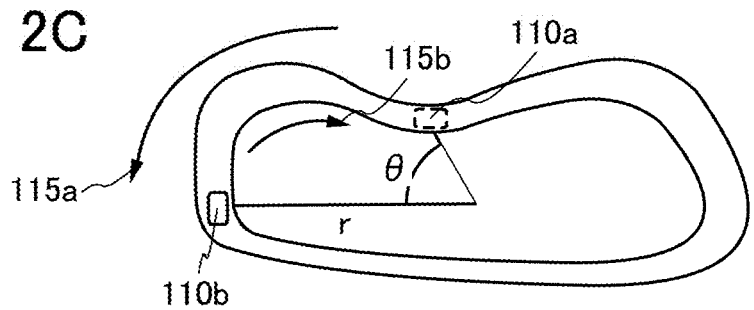

FIGS. 2A to 2C illustrate more detailed examples of how the display position of an image is determined.

FIG. 2A shows a case where the shape of the cross-section of a display device 100 is seen as a perfect circle. Note that in this specification, a perfect circle refers to a circle whose radius is constant.

FIG. 2A shows a case where the shape of the cross-section of the display device 100 is seen as a perfect circle with radius r (r>0) and the display device 100 rotates at an angle θ radian (θ>0) in the direction of an arrow 115b. At this time, the display position of an image can be configured to move, in a direction opposite to the rotation direction of the display device 100, that is, in the direction of an arrow 115a, a length of rθ (product of the angle and the radius). In FIG. 2A, an image 110a moves in the direction of the arrow 115a to be displayed as an image 110b.

Although a case where the cross-section of the display device 100 is seen as a perfect circle is shown in FIG. 2A, the cross-section of the display device 100 need not necessarily be a perfect circle. As long as the shape of the cross-section of the display device 100 is close to a perfect circle, the step illustrated by FIG. 2A can be taken. Furthermore, even when the shape of the cross-section of the display device 100 is not close to a perfect circle, when the step illustrated by FIG. 2A is taken, the image can be moved to a position where the image is more easily seen while using the simple step illustrated by FIG. 2A.

FIG. 2B shows a case where the cross-section of the display device 100 is seen as an ellipse. In FIG. 2B, although distance r (r>0) between the center of rotation and the display device 100 in a radial direction is not constant, the shape of the ellipse is determined if the major axis and the minor axis of the ellipse are given. Thus, the length of the arc of the ellipse, which corresponds to the angle θ radian (θ>0) of rotation of the display device 100, is determined; accordingly, the length the display position is moved can be determined. Therefore, in the case where the cross-section of the display device 100 is seen as an ellipse, the image can be moved to a position that can be more easily seen.

FIG. 2C shows a case where the cross-section of the display device 100 is seen as an arbitrary curve, for example, a closed curve. In FIG. 2C, although distance r (r>0) between the center of rotation and the display device 100 in a radial direction is not constant, the distance r can be measured in advance as a value f(θ) that is determined by an angle θ (θ>0). In that case, given that the position where the image 110a is displayed before the display device 100 rotates is an angle $θ_0$ radian ($θ_0$>0) and an angle of rotation of the display device 100 is Δθ radian (Δθ>0), the length the display position is moved (the length along the arc from the image 110a to the image 110b) can be expressed by a definite integral of f(θ) of a variable θ with an integral interval of [$θ_0$, $θ_0$+Δθ].

Accordingly, whatever the cross-sectional shape of the display device is, one embodiment of the present invention can be implemented.

The shape of the display device 100 shown in FIG. 1A is a band-like object. In FIG. 1B, an example in which the image 110a is moved to be the image 110b along the long-side direction of the band-like object is shown; however, one embodiment of the present invention is not limited thereto. For example, the display position of an image can be moved, in response to rotation of the display device 100 in the short-side direction of the band-like object, relatively with respect to the display device 100 and in the direction opposite to the rotation direction in the short-side direction of the band-like object. In that case, it is preferable that the display surface 120a extend to curve in the short-side direction of the band-like object, for example. A desired image can be displayed in a region where the image can be easily seen, such as the front face of the display surface 120a, and not in a region where the image cannot be easily seen, such as the rear face of the display surface 120a and the side surface in the short-side direction of the display surface 120a.

Although an example in which the image is moved in the long-side direction of the band-like object and an example in which the image is moved in the short-side direction of the band-like object are described above, these examples can be implemented in combination. Alternatively, only either one of these examples can be implemented. Further alternatively, these examples can be implemented, switching from one to the other.

For example, when the display device 100 is used as a wristwatch, a user may want to see a display of the wristwatch while lying. For example, there is a case where the user, while standing, sees the display region of the display surface 120a that can be seen when the user sees the back of his/her hand (as illustrated in FIG. 1A, for example), and there is a case where the user, while lying, sees the display region of the display surface 120a that can be seen when the user sees the palm of his/her hand (as illustrated in FIG. 1D, for example).

As shown in FIGS. 9A to 9D, the display position of an image can be determined based on the position of a user's face in a captured image 180, which is taken with the use of a camera portion 170 in the display device 100.

Figure 9A:
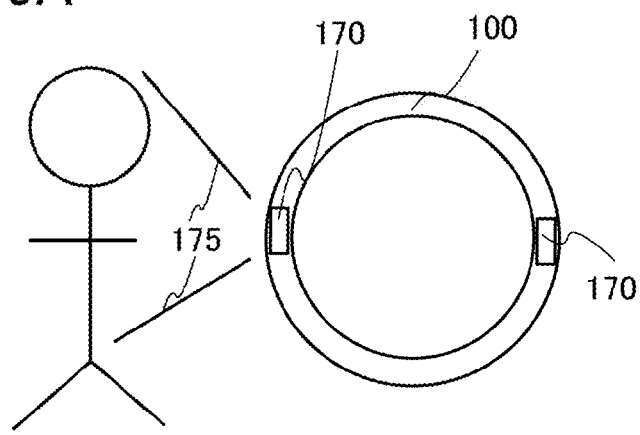
FIGS. 9A to 9D are drawings illustrating one embodiment of the present invention.

A case where the display device 100 is positioned lower than the user's face is illustrated in FIG. 9A. When the user wears the wristwatch around his/her wrist, for example, it is often the case that the user, while standing, sees the wristwatch that is positioned lower than his/her face.

Suppose a desired image is displayed in a position that can be easily seen, in the state of FIG. 9A. When a photograph of the user's face is taken with the use of the camera portion 170 in this state, the face is positioned in an upper portion of the captured image 180 as illustrated in FIG. 9C.

Figure 9B:
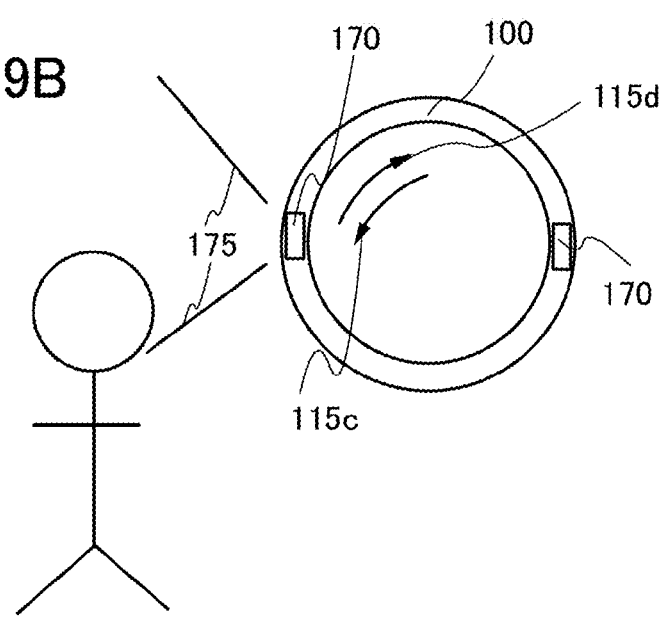

A case where the display device 100 is positioned higher than the user's face is illustrated in FIG. 9B. When the user wears the wristwatch around his/her wrist, for example, it is often the case that the user, while lying, sees the wristwatch that is positioned higher than his/her face.

Figure 9C:
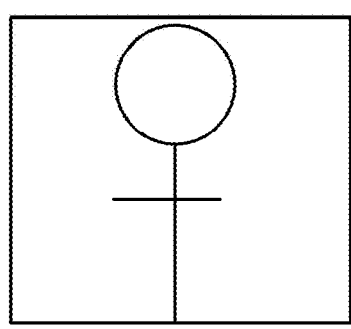
Figure 9D:
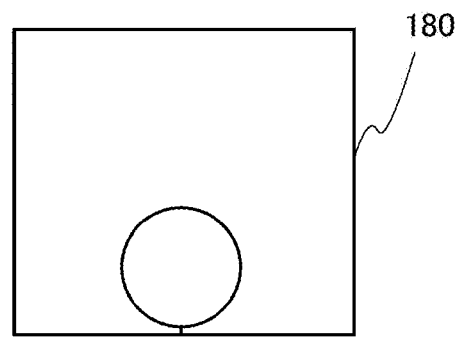

When a photograph of the user's face is taken with the use of the camera portion 170 in the state of FIG. 9B, the face is positioned in a lower portion of the captured image 180 as illustrated in FIG. 9D.

The position of the face in FIG. 9D is lower than that in FIG. 9C. Thus, the image is moved over the display surface in the direction of an arrow 115c, whereby the image can be displayed in a position that can be easily seen even in the state of FIG. 9B. The direction of the arrow 115c can be expressed as the direction directing downward the surface that a user can directly see.

It is preferable that the relation between the following two elements in the case where the display device 100 is moved relatively with respect to the user be determined in advance: the amount and direction of displacement of the position of the face in the captured image 180; and the length and direction of movement of the image over the display surface.

Furthermore, it is preferable that the relation between the following three elements in the case where the display device 100 is moved relatively with respect to the user be determined in advance: the amount and direction of displacement of the position of the face in the captured image 180; the area of the face in the captured image 180; and the length and direction of movement of the image over the display surface. When the distance between the user and the display device 100 changes, the area of the face in the captured image 180 changes, and also, the amount of displacement of the position of the face in the captured image 180 in the case where the display device 100 is moved relatively with respect to the user changes. Therefore, with the use of the relation with the area of the face in the captured image 180, the image can be moved more precisely over the display surface.

However, the relation with the area of the face in the captured image 180 is not necessarily required. For example, in the case where the display device 100 is used as a wearable device such as a wristwatch, the distance between the user and the display device 100 can be regarded as being hardly changed.

For example, a driving method of a display device including a camera portion, which includes the following steps can be implemented: a first step of capturing an image of an object with the use of the camera portion, when the display device and the object are in a first relative positional relationship; a second step of capturing an image of the object with the use of the camera portion, when the display device and the object are in a second relative positional relationship; and a third step of determining a display position of an image to be displayed on the display device in accordance with an amount and direction of displacement between a portion of the object in a first captured image that is captured in the first step and the portion of the object in a second captured image that is captured in the second step. The display device which performs the driving method can be provided. The driving method can be controlled by a program.

As described in the above example, even in the case where the display device 100 is moved relatively with respect to the user, a desired image can be displayed in a desired position on the display surface. For example, in the case where the position of a face in the captured image 180 captured by the display device 100 that has been moved relatively with respect to the user is higher than the position of the face in the captured image 180 as a reference, the image can be moved in the direction of an arrow 115d over the display surface.

Even in the case where the display device 100 is moved relatively with respect to the user and the display device rotates in the direction of the arrow 115c, the arrow 115d, or the like, a desired image can be displayed in a position that can be easily seen. In that case, techniques disclosed in this specification (e.g., FIGS. 2A to 2C and FIGS. 9A to 9D) may be combined.

It is preferable that a plurality of camera portions 170 be provided. With the plurality of camera portions 170, even when a face is positioned outside an imaging range 175 of one camera portion, an image of the face can be captured by another camera portion, whereby the display position of an image on the display surface can be determined in accordance with the position of the face in the captured image 180.

The display surface 120a preferably has a curved surface.

The outer peripheral surface on the opposite side and the side surface of the display surface 120a having a curved surface are regions that cannot be easily seen. Regions that cannot be easily seen are not limited to the outer peripheral surface on the opposite side or the side surface. The farther from the front face of the display surface 120a it is, the lower the visibility becomes. Reducing the luminance in a region with low visibility can reduce power consumption.

For example, in the case where an angle between a tangent plane of a first display region in the display surface 120a and a tangent plane of a second display region in the display surface 120a is greater than 0° and less than or equal to 180°, the luminance of the second display region can be made smaller than the luminance of the first display region. The angle between the tangent plane of the first display region and the tangent plane of the second display region may be an angle which becomes larger as the first display region and the second display region becomes farther from each other. Here, the first display region and the second display region do not overlap with each other.

Here, the first display region is the front face of the display surface 120a, for example, and the second display region is the side surface of the display surface 120a, for example. The case where the angle between the tangent plane of the first display region and the tangent plane of the second display region is 90° corresponds to, for example, the case where the first display region is the front face and the second display region is the side surface. The case where the angle between the tangent plane of the first display region and the tangent plane of the second display region is 180° corresponds to, for example, the case where the first display region is the front face and the second display region is the outer peripheral surface on the opposite side.

In the case where the angle between the tangent plane of the first display region and the tangent plane of the second display region is greater than or equal to 90°, when the first display region is visible, the second display region can hardly be seen.

Then, in the case where the angle between the tangent plane of the first display region and the tangent plane of the second display region is greater than 0° and less than 90°, for example, the luminance of the second display region can be made smaller than the luminance of the first display region. In the case where the angle between the tangent plane of the first display region and the tangent plane of the second display region is greater than or equal to 90° and less than or equal to 180°, for example, the luminance of the second display region can be made smaller than the luminance of the first display region, or alternatively, display in the second display region can be turned off.

In the case where the angle between the tangent plane of the first display region and the tangent plane of the second display region is greater than a viewing angle of the display device 100 and less than or equal to 180°, for example, the luminance of the second display region can be made smaller than the luminance of the first display region, or alternatively, display in the second display region can be turned off. In the case where the first display region is the front face and when the angle between the tangent plane of the first display region and the tangent plane of the second display region is greater than half of a viewing angle of the display device 100 and less than or equal to 180°, for example, the luminance of the second display region can be made smaller than the luminance of the first display region, or alternatively, display in the second display region can be turned off.

By adjusting a current flowing in or a voltage applied to a display element of the display portion 120, the luminance of the display surface 120a can be adjusted.

It is important in a device which is supposed to be carried around, such as a wearable device (e.g., a wristwatch), that the power consumption be suppressed. Reducing the luminance of part of the display surface 120a or turning off display of part of the display surface 120a as described above can suppress power consumption of the display device 100. In addition, reducing the luminance of the display surface 120a or turning off display thereof has a synergistic effect of extending the lifetime of the display device.

The display device 100 can be provided with a touch panel. Employing the touch panel can cut an area for the operational button in the display surface 120a, thereby increasing the size of the display surface 120a or miniaturizing the display device 100.

The touch panel can sense operational information on the display surface 120a, and the display position of the image 110a can be determined in accordance with the operational information. For example, an action of tracing the display surface 120a with a finger or a pen, or an action of tapping the display surface 120a may be the operational information.

For example, by tracing the display surface 120a with a finger or a pen along a circumferential direction, in the downward direction in FIG. 1B, the image 110a can be moved in the direction of the arrow 115a over the display surface 120a. In other words, tracing the display surface 120a with a finger or a pen can scroll the image 110a. By tracing the display surface 120a with a finger or a pen in the direction of the arrow 115a in FIG. 1B, the image displayed on the outer peripheral surface on the opposite side of the display surface 120a as illustrated in FIG. 1D can be moved to the front face of the display surface 120a as illustrated in FIG. 1B.

In the ring-shaped display device 100 shown in FIG. 1B, for example, when the display surface 120a is scrolled in the direction of the arrow 115a, the image 110a moves to a lower portion of the display surface 120a of FIG. 1B. When the display surface 120a is further scrolled in the direction of the arrow 115a, the image 110a moves from the front face shown in FIG. 1B to the outer peripheral surface on the opposite side, that is, to a lower portion of the display surface 120a of FIG. 1D. When the display surface 120a is further scrolled in the direction of the arrow 115a, the image 110a moves to an upper portion of the display surface 120a of FIG. 1D. When the display surface 120a is further scrolled in the direction of the arrow 115a, the image 110a appears at an upper portion of the display surface 120a of FIG. 1B.

The scrolling action described above can be performed in the case where the display surface 120a has a gap in a circumferential direction as shown in FIG. 1B or in the case where the display surface 120a is continuous in a circumferential direction.

In some cases, the image 110a extends beyond the front face of the display surface 120a shown in FIG. 1A to the outer peripheral surface on the opposite side of the display surface 120a shown in FIG. 1D. In that case, the image 110a can be reduced in size by an action of double-tapping the image 110a as a trigger, for example.

In the case where the image 110a is reduced in size, the image 110a is reduced in size while keeping the aspect ratio unchanged, whereby distortion of the image can be prevented.

Figure 3A:
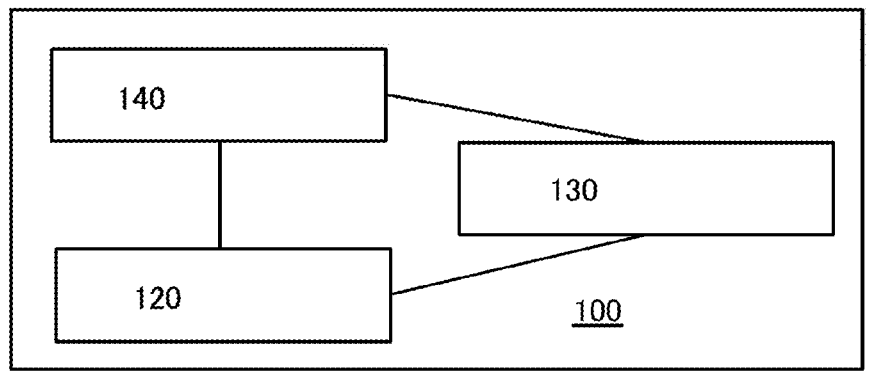
FIGS. 3A to 3C are block diagrams showing one embodiment of the present invention.

As shown in FIG. 3A, the display device 100 can include a memory medium 130. A program for executing the above action can be stored in the memory medium 130. The memory medium 130 is a computer-readable memory medium. The memory medium 130 can be electrically connected to a sensing unit 140 and a display portion 120. The sensing unit 140 and the display portion 120 can be electrically connected to each other.

Figure 3B:
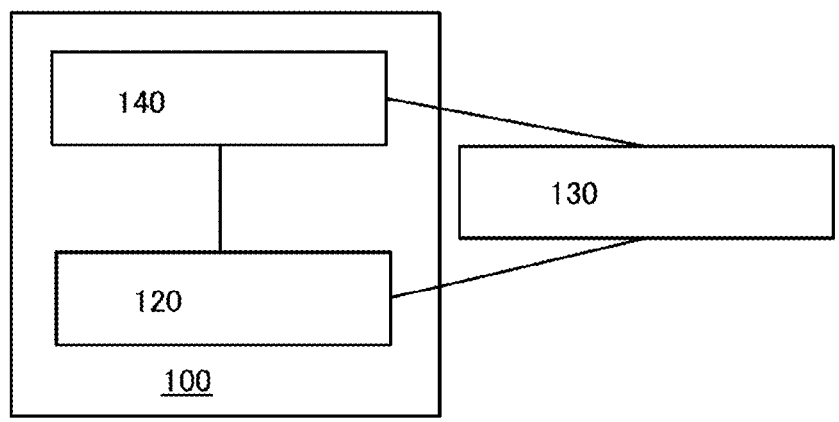

The memory medium 130 may exist outside the display device 100, as shown in FIG. 3B. In that case, the memory medium 130 can be electrically connected to the sensing unit 140 and the display portion 120 via a terminal portion of the display device 100. Alternatively, the memory medium 130 may be connected to the sensing unit 140 and the display portion 120 wirelessly. In addition, the sensing unit 140 and the display portion 120 may be connected to each other wirelessly.

By connecting components (e.g., the display portion 120, the memory medium 130, and the sensing unit 140) wirelessly, a contact failure can be prevented. Furthermore, the display device 100 can be miniaturized.

A program giving the following instructions can be stored in the memory medium 130: an instruction to rewrite an image in the case where the sensing unit 140 senses displacement of the display device 100, and an instruction not to rewrite an image or to maintain a displayed image in the case where the sensing unit 140 does not sense displacement of the display device 100. In this way, power consumption associated with rewriting an image can be reduced.

Reduction in power consumption is important for a device that is supposed to be carried around without connecting to a power supply, such as a wearable device (e.g., wristwatch). In other words, employing the above-described power saving structure for the device that is supposed to be carried around without connecting to a power supply, such as a wearable device (e.g., wristwatch), is more effective than employing the same for a device used with a power supply connected thereto.

Figure 3C:
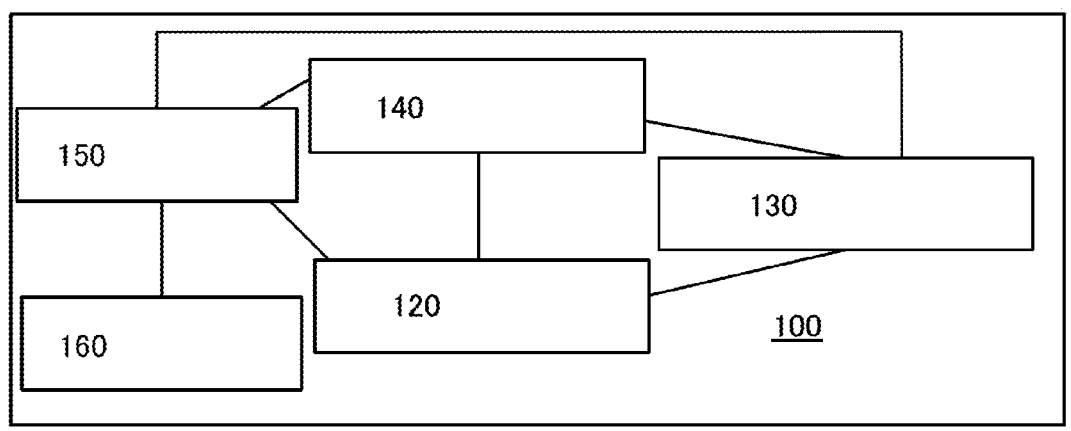

As shown in FIG. 3C the display device 100 can include a battery 150. The battery 150 is a primary battery or a secondary battery, for example. In the case where the display device 100 includes a secondary battery as the battery 150, the battery 150 can be charged wirelessly or by cable connection. The display device 100 can include a power generation mechanism 160. Electric power generated by the power generation mechanism 160 can be accumulated in the secondary battery. The power generation mechanism 160 is a solar battery, or a thermoelectric conversion element (such as a Peltier element), for example. In the case where the display device 100 is used as a wearable device such as a wristwatch, a thermoelectric conversion element is preferably used as the power generation mechanism 160, because electric power can be constantly generated owing to temperature difference between body temperature and ambient temperature. However, the power generation mechanism 160 is not limited to the above. The power generation mechanism 160 can be, for example, a mechanism that converts rotational energy of the display device 100 into electric power or a mechanism that converts vibrational energy into electric power. The mechanism that converts rotational energy of the display device 100 into electric power can generate electric power in accordance with rotation of the display device 100, and transmit the generated electric power to the secondary battery. An acceleration sensor or a gyroscope sensor may be used as the power generation mechanism 160.

The following two modes, switching from one to the other, can be performed: a mode in which a display position of an image is moved when the display device is moved, as described above; and a mode in which a display position of an image is not moved even when the display device is moved.

Figure 4:
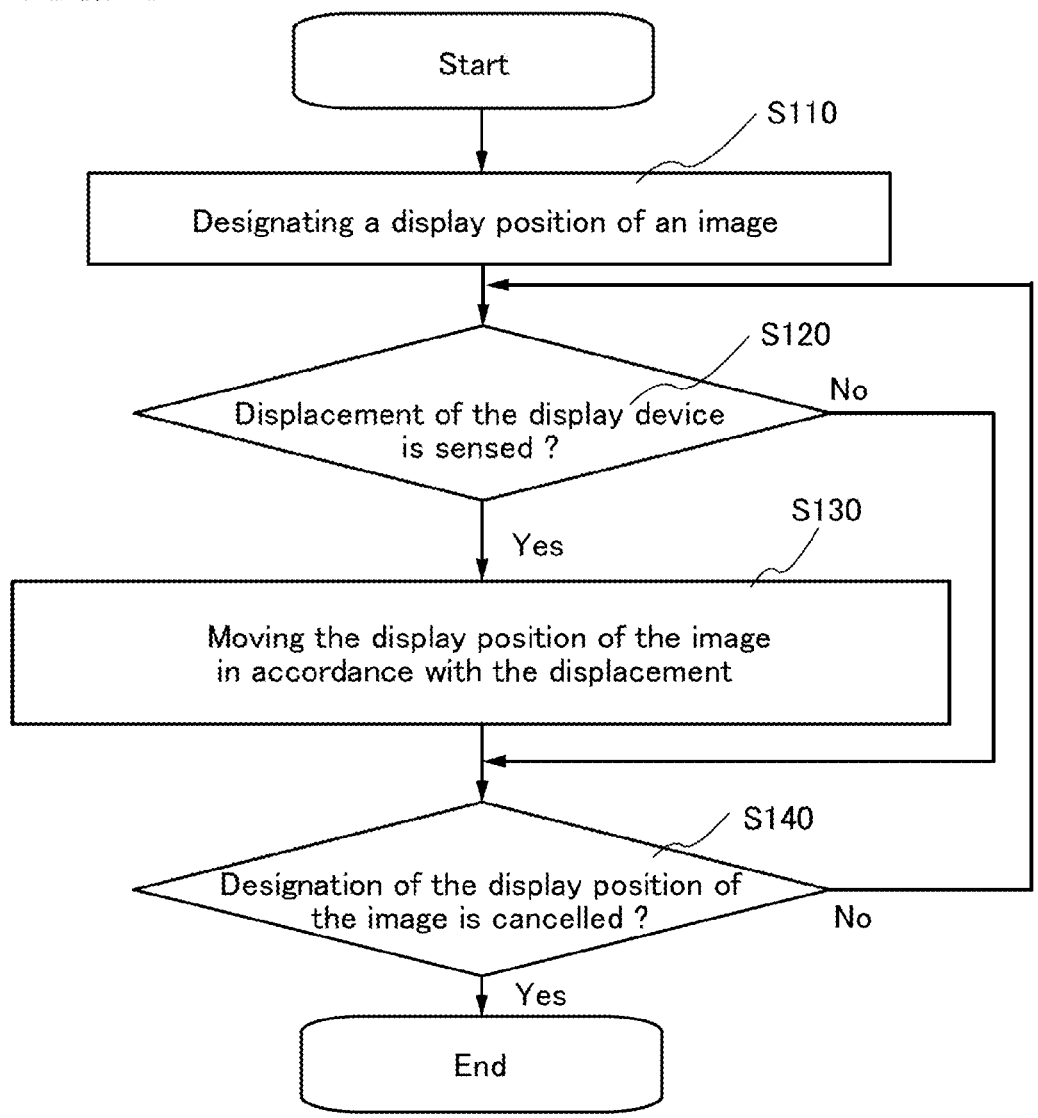
FIG. 4 is a flowchart showing one embodiment of the present invention.

FIG. 4 shows an example of a driving method of the display device 100. First, a step (S110) of designating a display position of an image is conducted. Through the step S110, the mode is switched to the one in which a display position of an image is moved when the display device 100 is moved.

A display position of an image can be set in advance. Alternatively, a display position of an image may be set as a default. In these cases, the step S110 can be omitted, and preferably, the mode in which a display position of an image is moved when the display device is moved has already been set.

Next, displacement of the display device 100 is sensed (S120). When displacement of the display device 100 is sensed, a step S130 is conducted. When displacement of the display device 100 is not sensed, the step S130 is not conducted.

Displacement of the display device 100 may include rotational displacement based on rotation in a circumferential direction of the display device 100. The rotational displacement includes, for example, a direction of rotation, or an angle of rotation.

Figure 5:
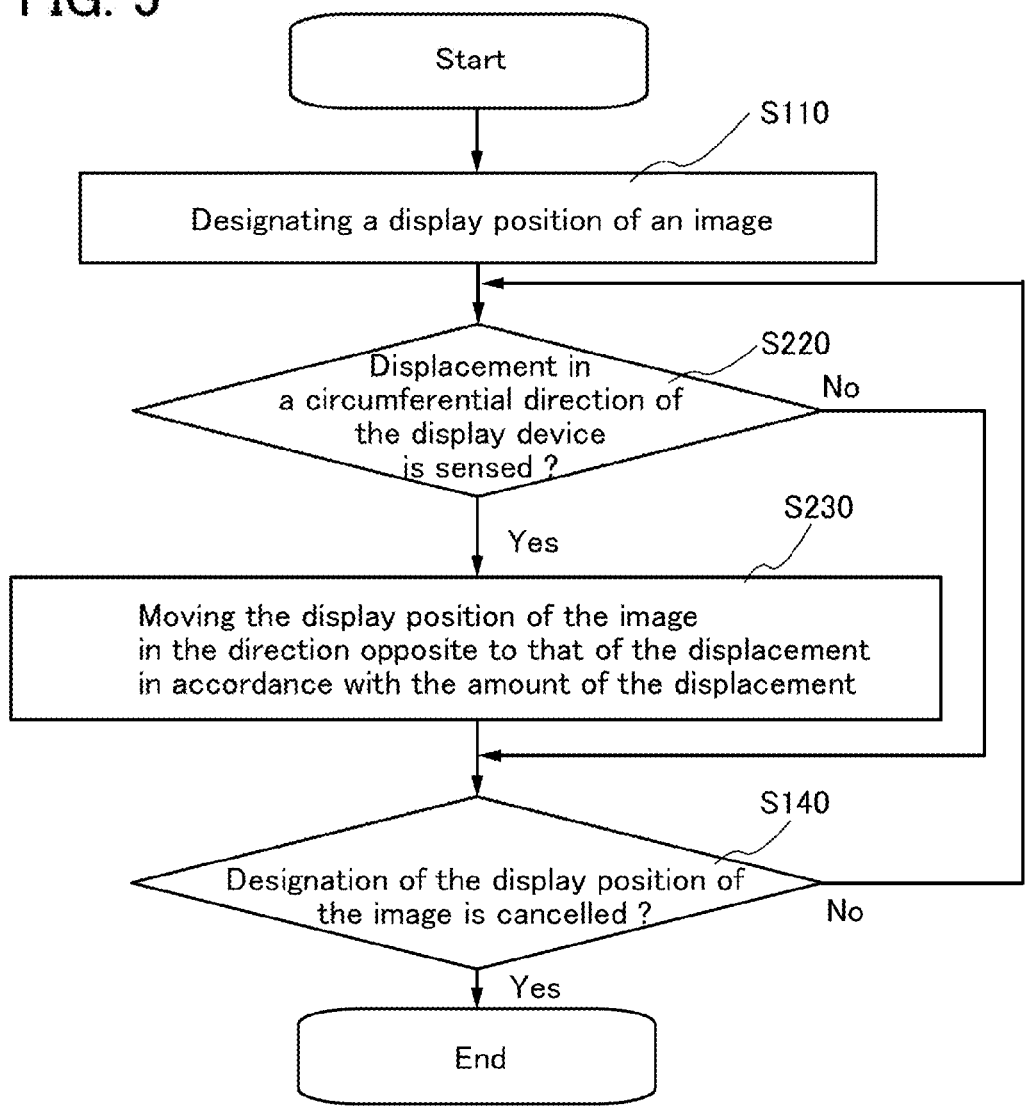
FIG. 5 is a flowchart showing one embodiment of the present invention.

A step of sensing displacement in a circumferential direction of the display device 100 (S220), instead of the step S120, can be conducted as shown in FIG. 5.

Displacement of the display device 100 can be sensed by a sensing unit such as an acceleration sensor or a gyroscope sensor.

The acceleration sensor is, for example, a biaxial acceleration sensor or a triaxial acceleration sensor.

A uniaxial acceleration sensor can also be used as the acceleration sensor.

Displacement can be sensed by a plurality of acceleration sensors.

Displacement can be sensed by a sensor that senses an inclination, other than the acceleration sensor or the gyroscope sensor.

The displacement may include geographical displacement. Geographical displacement is, for example, coordinate displacement expressed by longitude and latitude. The geographical displacement may further include coordinate in the height direction. In order to sense geographical displacement, a satellite positioning system, specifically, a GPS may be utilized, for example.

Next, the display position of the image is moved in accordance with displacement of the display device 100 (S130). For example, a step (S230) of moving the display position of the image in the direction opposite to that of the displacement of the display device 100 in accordance with the amount of the displacement can be conducted, as shown in FIG. 5. Alternatively, the display position of the image can be moved by the method illustrated in FIGS. 2A to 2C and described by the corresponding explanation.

Next, whether designation of the display position of the image is cancelled or not is determined (S140). In the case where it is determined that designation of the display position of the image is cancelled, the mode in which a display position of an image is moved when the display device is moved is terminated and switched to the mode in which a display position of an image is not moved even when the display device is moved. In the case where it is determined that designation of the display position of the image is not cancelled, the step S120 is conducted again.

By performing the mode in which a display position of an image is moved when the display device is moved and the mode in which a display position of an image is not moved even when the display device is moved, switching from one to the other as described above, power consumption can be reduced.

Reduction in power consumption is important for a device that is supposed to be carried around without connecting to a power supply, such as a wearable device (e.g., wristwatch). In other words, employing the above-described power saving structure for the device that is supposed to be carried around without connecting to a power supply, such as a wearable device (e.g., wristwatch), is more effective than employing the same for a device used with a power supply connected thereto.

In the case where the steps S120, S130, and S140 are repeated, the frequency of repetition can be set as appropriate. For example, the step S120 can be conducted once every 1/60 or less seconds. Alternatively, a time period from the determination that designation of the display position of the image is not cancelled in the step S140 to the start of the step S120 can be longer than 0 second and shorter than or equal to 1/60 seconds.

In the step S110, a display position of an image can be designated by an action of touching the image 110a displayed on the display surface 120a or approaching the image 110a displayed on the display surface 120a, for example, as a trigger.

A button for designating a display position of an image can be provided on the display device 100. Touching or approaching the image 110a in order to designate a display position of an image may lead to an unwanted operation such as mistakenly moving an object. The provision of the button for designating a display position of an image on the display device 100 can reduce the possibility of unwanted operations.

In the step S110, the display position of the image 110a can be designated by sounds as a trigger, for example. The display position of the image 110a can be designated by a voice saying "designation of display position", for example.

In the step S110, an action such as tapping, double-tapping, holding, flicking, or pinching can be a trigger, for example.

In the step S110, a display position of an image can be designated by an action of tracing the display surface 120a with a finger or a pen, as a trigger, for example. Tracing the display surface 120a down and then to the right, that is, an action of drawing an L can be a trigger, for example. Such an action can be called gesture. Tracing the display surface 120a down and then to the right, and further tracing down can be a trigger. Tracing the display surface 120a down and then to the left can be a trigger. A gesture combining one or more of the following actions may be utilized: tracing the display surface 120a up, down, to the right, and to the left. Furthermore, a gesture combining an action of tracing the display surface 120a in an oblique direction with any of the above actions can be utilized. An action of drawing a curve such as a circle can be a trigger. An action of tracing the display surface 120a does not necessarily require contacting the display surface.

An action of tracing the display surface up or down may be used for scrolling an image, and an action of tracing the display surface to the right or to the left may be used for displaying an adjacent display region. Therefore, making an action of tracing the display surface in two directions selected from up, down, to the right, and to the left successively a trigger is preferable, since such an action can be distinguished from an action of tracing the display surface in only one direction.

Such a setting as follows is possible: only while a button provided on the display device 100 is pushed, a mode in which a gesture serves as a trigger is active.

The methods described in this specification can be controlled by a program.

This embodiment can be combined with descriptions in this specification such as another embodiment.

(Embodiment 2)

How an image is displayed on the display surface 120a will be described with reference to FIGS. 6A to 6C.

The image to be displayed may be an object such as a clock, weather, temperature, humidity stock prices, or exchange rates, for example. The object may be an icon or a widget. The display surface 120a can display a wallpaper in addition to the object. The display surface 120a can display an operational button in addition to the object. The operational button is, for example, a button having a function of returning to the previous screen, a button having a function of displaying a home screen, or a keyboard. Alternatively, the wallpaper or the operational button can be displayed instead of the object.

Description in this embodiment will be given, regarding the image as an object. Thus, the object may be replaced with another image.

Figure 6A:
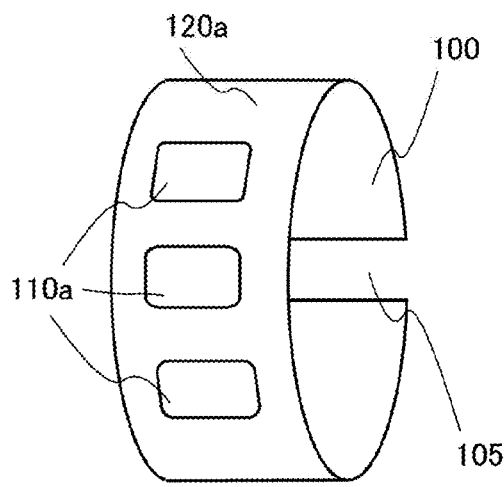
FIGS. 6A to 6C are perspective views showing one embodiment of the present invention.
Figure 6B:
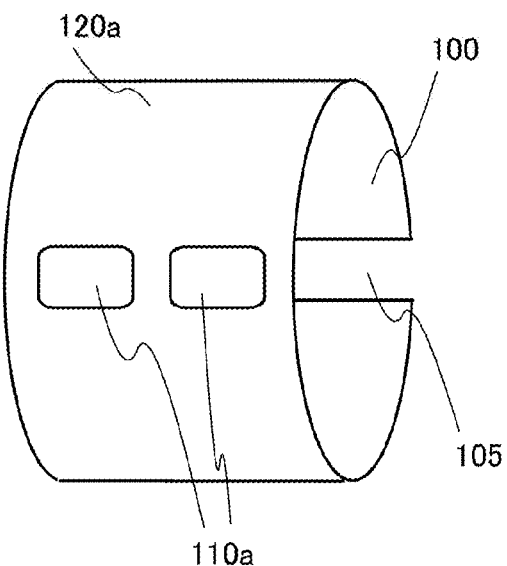
Figure 6C:
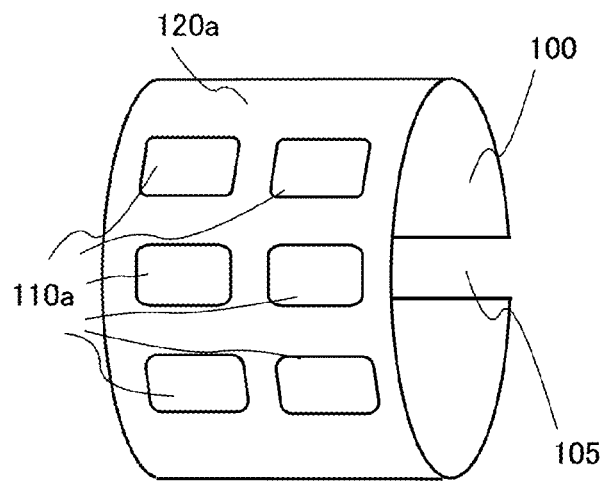

A plurality of objects can be displayed on the display surface 120a, as shown in FIGS. 6A to 6C. Specifically, a plurality of objects can be displayed in a region of the display surface 120a that can be seen (e.g., the front face of the display surface 120a). Needless to say an object can be displayed on an outer peripheral surface on the opposite side of the display surface 120a.

The display surface 120a can display a plurality of objects arranged along a circumferential direction of the display device 100, as shown in FIG. 6A. The number of objects displayed on the display surface 120a is not limited to three, and may be one, two, four, or more.

The display surface 120a can display a plurality of objects arranged in a direction crossing a circumferential direction of the display device 100 (e.g., a direction perpendicular to the circumferential direction) as shown in FIG. 6B. Although an upper portion or a lower portion of the display surface 120a is a region difficult to be seen sometimes, arranging objects as shown in FIG. 6B enables displaying many objects in a region that can be easily seen. The number of objects displayed on the display surface 120a is not limited to two, and may be one, three, or more.

The display surface 120a can display a plurality of objects arranged in a circumferential direction of the display device 100 and a direction crossing a circumferential direction of the display device 100 (e.g., a direction perpendicular to the circumferential direction) as shown in FIG. 6C. In other words, the display surface 120a can display objects in a matrix form. The number of objects displayed on the display surface 120a is not limited to six, and may be one, two, three, four, five, seven, or more.

The display device 100 can be provided with a telephone function. A button for performing the telephone function can be displayed as an object on the display surface 120a.

Examples of the objects include a clock, whether, temperature, humidity, stock prices, exchange rates, a map, electronic money, blood pressure, body temperature, and a pulse. In the case where the display device is a wearable device such as a wristwatch, it is preferable that blood pressure, body temperature, a pulse, or the like be displayed as the object. The blood pressure, body temperature, pulse, or the like is not necessarily limited to those of a person or an animal wearing the wearable device such as a wristwatch. For example, the blood pressure, body temperature, or pulse of a person or an animal in a remote location can also be displayed.

In the case where weather is adopted as the object, "sunny", "cloudy", "rainy", or the like can be displayed. The weather at the point when the display is checked may be displayed, or a weather forecast may be displayed. The displayed weather is preferably changed depending on the area where the display device exists. In that case, a satellite positioning system, specifically a GPS may be utilized, for example, in order to sense the geographical positional information of the display device.

This embodiment can be combined with descriptions in this specification such as another embodiment.

(Embodiment 3)

In this embodiment, an example of an arm-worn display device will be described. A perspective view of the display device is shown in FIG. 7.

Figure 7:
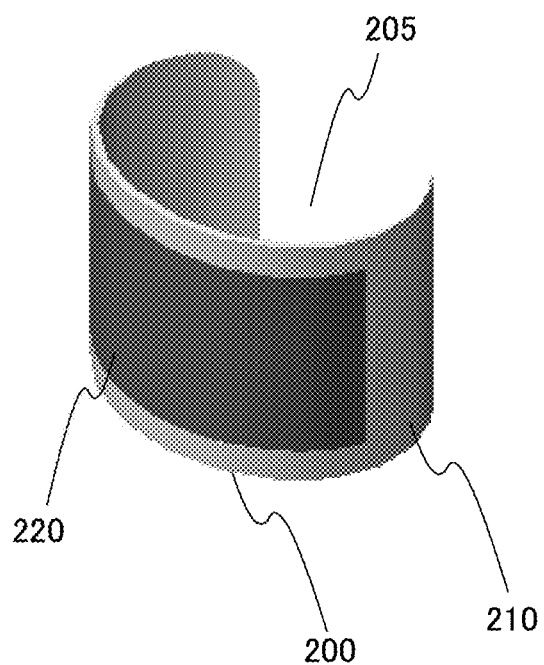
FIG. 7 is a perspective view showing one embodiment of the present invention.

As shown in FIG. 7, a display device 200 includes a display portion 220 having flexibility on a curved surface of a support structure body 210.

The support structure body 210 is in the form of a bracelet obtained by curving a band-like object. In addition, at least part of the support structure body 210 has flexibility and can be moved so as to extend a gap 205, whereby the display device can be put around a wrist. An end portion of the support structure body 210 illustrated in FIG. 7 is bendable, and a middle portion apart from the end portion hardly changes its shape. Therefore, the middle portion of the support structure body 210 maintains a curvature with which the display portion is attached and fixed in fabrication; thus, the display portion 220 overlapping with the middle portion is hardly damaged even when the display device is repeatedly put on and taken off from a wrist.

In the case where an active-matrix display device is provided as the display portion 220, the active-matrix display device includes at least a layer including transistors. The reliability of the layer including transistors is not easily decreased when the layer is only attached and fixed to the curved surface of the support structure body 210. However, the reliability might be decreased when the layer including transistors is repeatedly bent in such a manner that the layer including transistors is curved toward one side into a concave shape, returned to a flat shape, and then curved toward the other side into a convex shape. Also in this regard, since the middle portion of the support structure body 210 illustrated in FIG. 7 hardly changes its shape, when the layer including transistors is fixed to the curved surface of the support structure body 210, the layer is curved toward only one side even if it is bent. In other words, the support structure body 210 functions as a protective member which prevents the display portion 220 from being curved excessively or from being twisted and deformed significantly.

As a material of the support structure body 210, a metal, a resin, a natural material, or the like can be used. The support structure body 210 preferably has a small thickness so as to be lightweight. A metal is preferably used as a material of the support structure body 210 because a metal has high impact resistance and high heat conductivity. A resin is preferably used as a material of the support structure body 210 because the resin can achieve a reduction in weight and does not cause metal allergy.

The shape of the display device illustrated in FIG. 7 is an example, and a belt or a clasp for fixing to a wrist may be provided. Alternatively, the display device may be in the form of a ring or a cylinder tube so as to surround a wrist.

Although the example of the display device to be worn on an arm such as a wrist or an upper arm is described, the position is not particularly limited, and the display device may be worn on any part of a human body such as an ankle. In the case where the display device is worn on an ankle, the display device may be manufactured to have a shape different from that illustrated in FIG. 7 and have a size to fit an ankle shape.

This embodiment can be combined with descriptions in this specification such as another embodiment.

(Embodiment 4)

In this embodiment, examples of a flexible light-emitting device (light-emitting panel) will be described.

<Specific Example 1>

Figure 10A:
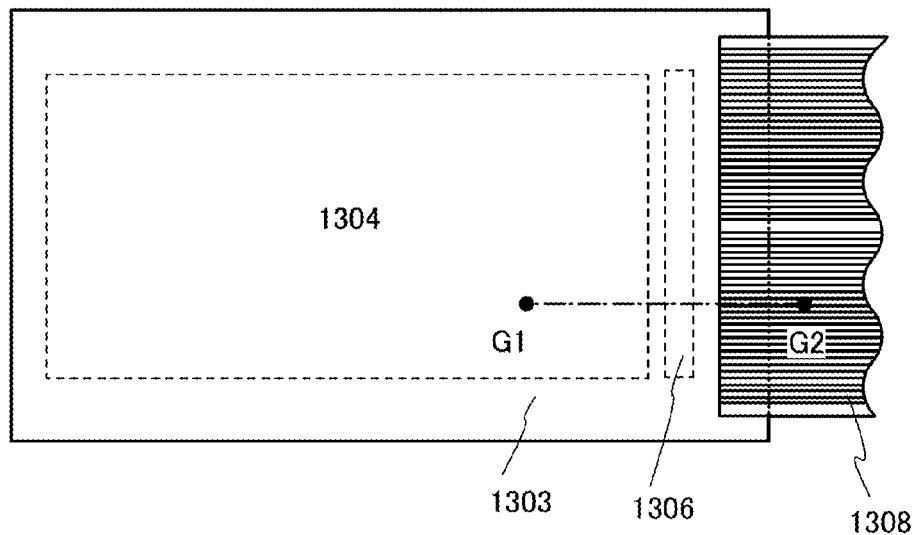
FIGS. 10A and 10B illustrate a light-emitting panel according to one embodiment.
Figure 10B:
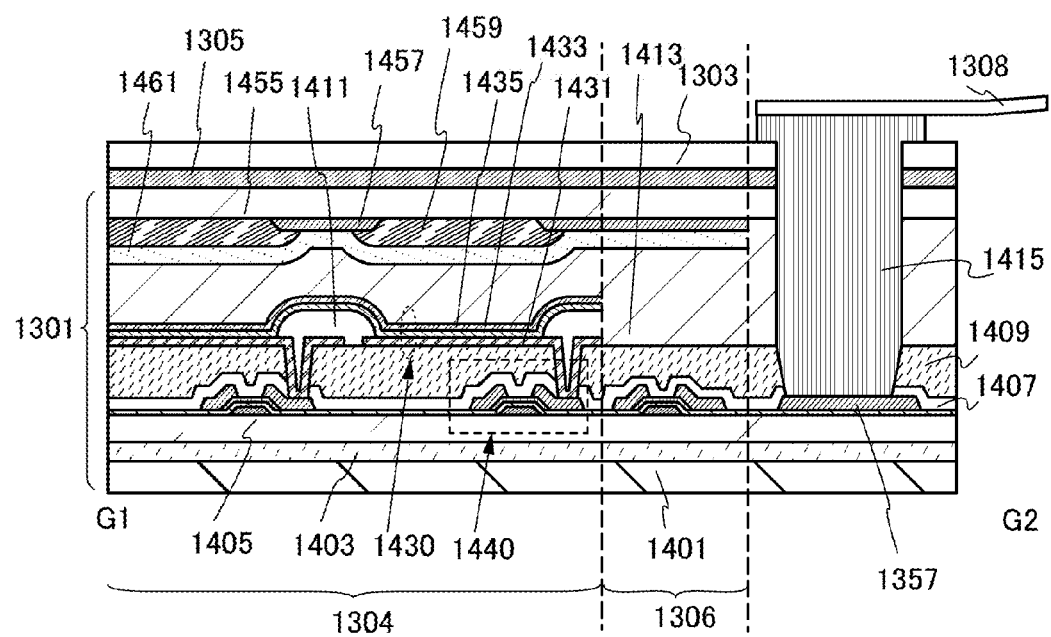
Figure 14A:
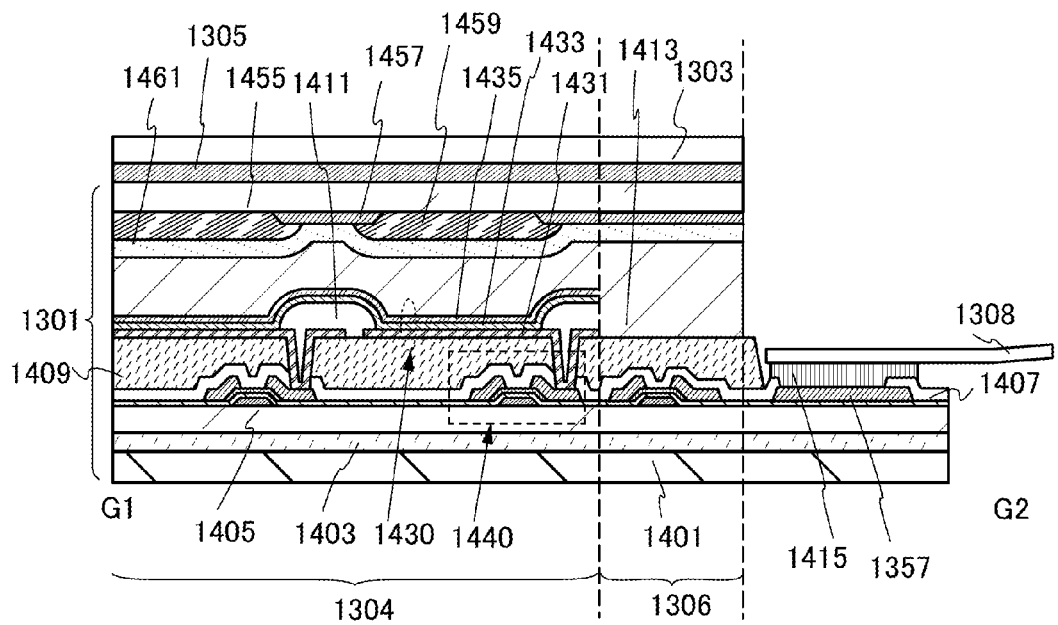
FIGS. 14A and 14B illustrate a light-emitting panel according to one embodiment.
Figure 14B:
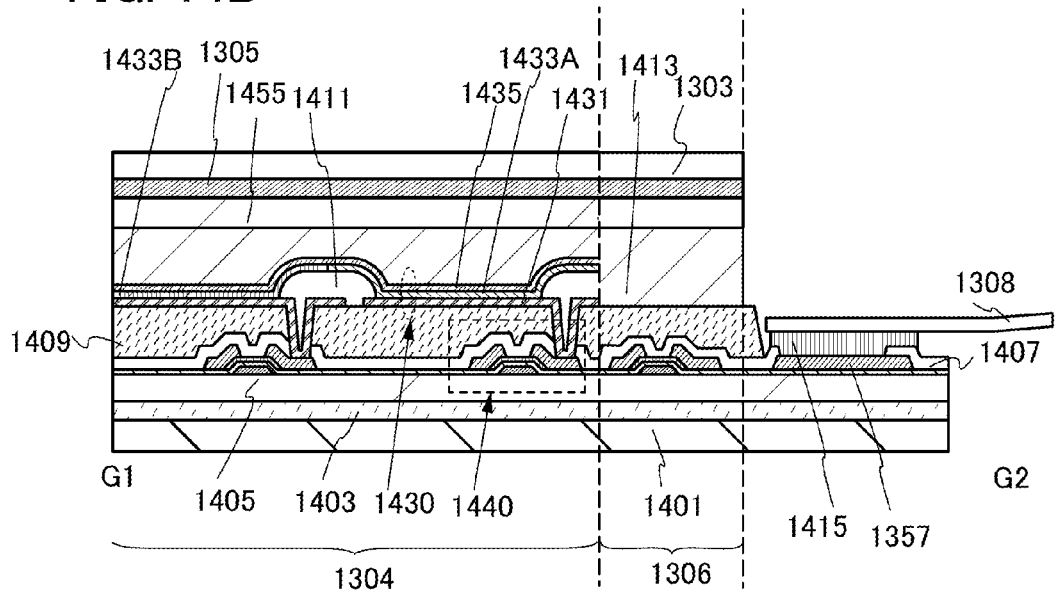

FIG. 10A is a plan view of the flexible light-emitting panel, and FIG. 10B is an example of a cross-sectional view taken along dashed-dotted line G1-G2 in FIG. 10A. Other examples of the cross-sectional views are shown in FIGS. 14A and 14B.

The light-emitting panel shown in FIG. 10B includes an element layer 1301, a bonding layer 1305, and a substrate 1303. The element layer 1301 includes a substrate 1401, a bonding layer 1403, an insulating layer 1405, a plurality of transistors, a conductive layer 1357, an insulating layer 1407, an insulating layer 1409, a plurality of light-emitting elements, an insulating layer 1411, a sealing layer 1413, an insulating layer 1461, a coloring layer 1459, a light-blocking layer 1457, and an insulating layer 1455.

The conductive layer 1357 is electrically connected to an FPC 1308 via a connector 1415.

A light-emitting element 1430 includes a lower electrode 1431, an EL layer 1433, and an upper electrode 1435. The lower electrode 1431 is electrically connected to a source electrode or a drain electrode of a transistor 1440. An end portion of the lower electrode 1431 is covered with the insulating layer 1411. The light-emitting element 1430 has a top emission structure. The upper electrode 1435 has a light-transmitting property and transmits light emitted from the EL layer 1433.

Note that an EL layer 1433A and an EL layer 1433B may be used as shown in FIG. 14B so that pixels have different EL layers. In that case, light with different colors are emitted. Thus, the coloring layer 1459 and the like need not necessarily be provided in such a case.

The coloring layer 1459 is provided to overlap with the light-emitting element 1430, and the light-blocking layer 1457 is provided to overlap with the insulating layer 1411.

The coloring layer 1459 and the light-blocking layer 1457 are covered with the insulating layer 1461. The space between the light-emitting element 1430 and the insulating layer 1461 is filled with the sealing layer 1413.

The light-emitting panel includes a plurality of transistors in a light extraction portion 1304 and a driver circuit portion 1306. The transistor 1440 is provided over the insulating layer 1405. The insulating layer 1405 and the substrate 1401 are attached to each other with the bonding layer 1403. The insulating layer 1455 and the substrate 1303 are attached to each other with the bonding layer 1305. It is preferable to use films with low water permeability for the insulating layer 1405 and the insulating layer 1455, in which case an impurity such as water can be prevented from entering the light-emitting element 1430 or the transistor 1440, leading to improved reliability of the light-emitting panel. The bonding layer 1403 can be formed using a material similar to that of the bonding layer 1305.

The light-emitting panel in Specific Example 1 can be manufactured in the following manner: the insulating layer 1405, the transistor 1440, and the light-emitting element 1430 are formed over a formation substrate with high heat resistance; the formation substrate is separated; and the insulating layer 1405, the transistor 1440, and the light-emitting element 1430 are transferred to the substrate 1401 and attached thereto with the bonding layer 1403. Also, the light-emitting panel in Specific Example 1 can be manufactured in the following manner: the insulating layer 1455, the coloring layer 1459, and the light-blocking layer 1457 are formed over a formation substrate with high heat resistance; the formation substrate is separated; and the insulating layer 1455, the coloring layer 1459, and the light-blocking layer 1457 are transferred to the substrate 1303 and attached thereto with the bonding layer 1305.

In the case where a material with high water permeability and low heat resistance (e.g., resin) is used for a substrate, it is impossible to expose the substrate to high temperature in the manufacturing process. Thus, there is a limitation on conditions for forming a transistor and an insulating film over the substrate. In the manufacturing method of this embodiment, a transistor and the like can be formed over a formation substrate with high heat resistance; thus, a highly reliable transistor and an insulating film with sufficiently low water permeability can be formed. Then, the transistor and the insulating film are transferred to the substrate 1303 and the substrate 1401, whereby a highly reliable light-emitting panel can be manufactured. Thus, with one embodiment of the present invention, a thin or/and lightweight light-emitting device with high reliability can be provided. Details of the manufacturing method will be described later.

The substrate 1303 and the substrate 1401 are each preferably formed using a material with high toughness. In that case, a display device with high impact resistance that is less likely to be broken can be provided. For example, when the substrate 1303 is an organic resin substrate and the substrate 1401 is a substrate formed using a thin metal material or a thin alloy material, the light-emitting panel can be lightweight and less likely to be broken as compared with the case where a glass substrate is used.

A metal material and an alloy material, which have high thermal conductivity, are preferred because they can easily conduct heat to the whole substrate and accordingly can prevent a local temperature rise in the light-emitting panel. The thickness of a substrate using a metal material or an alloy material is preferably greater than or equal to 10 µm and less than or equal to 200 µm, further preferably greater than or equal to 20 µm and less than or equal to 50 µm.

Further, when a material with high thermal emissivity is used for the substrate 1401, the surface temperature of the light-emitting panel can be prevented from rising, leading to prevention of breakage or a decrease in reliability of the light-emitting panel. For example, the substrate 1401 may have a stacked structure of a metal substrate and a layer with high thermal emissivity (the layer can be formed using a metal oxide or a ceramic material, for example).

<Specific Example 2>

Figure 11A:
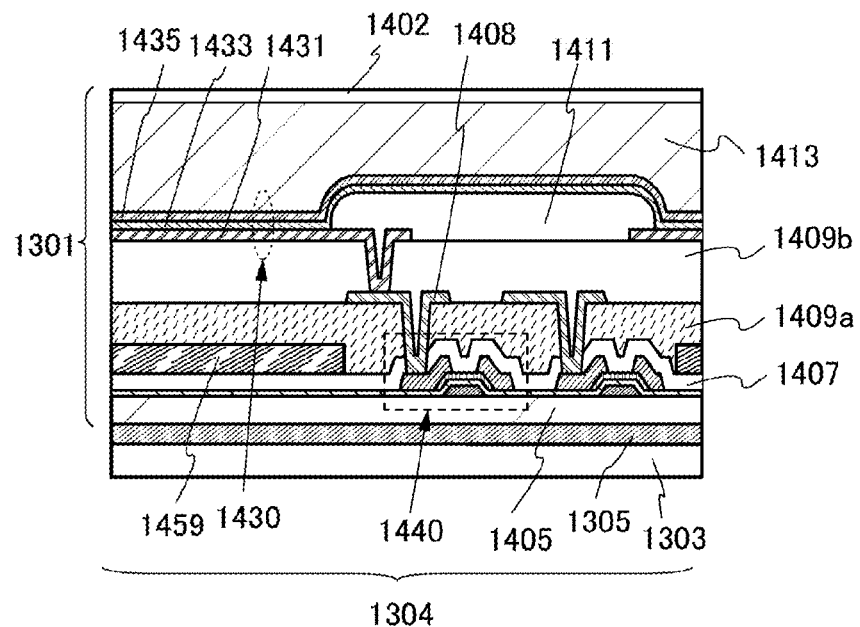
FIGS. 11A and 11B illustrate a light-emitting panel according to one embodiment.

FIG. 11A shows another example of a light extraction portion 1304 in the light-emitting panel.

The light extraction portion 1304 in FIG. 11A includes a substrate 1303, a bonding layer 1305, a substrate 1402, an insulating layer 1405, a plurality of transistors, an insulating layer 1407, a conductive layer 1408, an insulating layer 1409a, an insulating layer 1409b, a plurality of light-emitting elements, an insulating layer 1411, a sealing layer 1413, and a coloring layer 1459.

A light-emitting element 1430 includes a lower electrode 1431, an EL layer 1433, and an upper electrode 1435. The lower electrode 1431 is electrically connected to a source electrode or a drain electrode of a transistor 1440 via the conductive layer 1408. An end portion of the lower electrode 1431 is covered with the insulating layer 1411. The light-emitting element 1430 has a bottom emission structure. The lower electrode 1431 has a light-transmitting property and transmits light emitted from the EL layer 1433.

The coloring layer 1459 is provided to overlap with the light-emitting element 1430, and light emitted from the light-emitting element 1430 is extracted from the substrate 1303 side through the coloring layer 1459. The space between the light-emitting element 1430 and the substrate 1402 is filled with the sealing layer 1413. The substrate 1402 can be formed using a material similar to that of the substrate 1401.

<Specific Example 3>

Figure 11B:
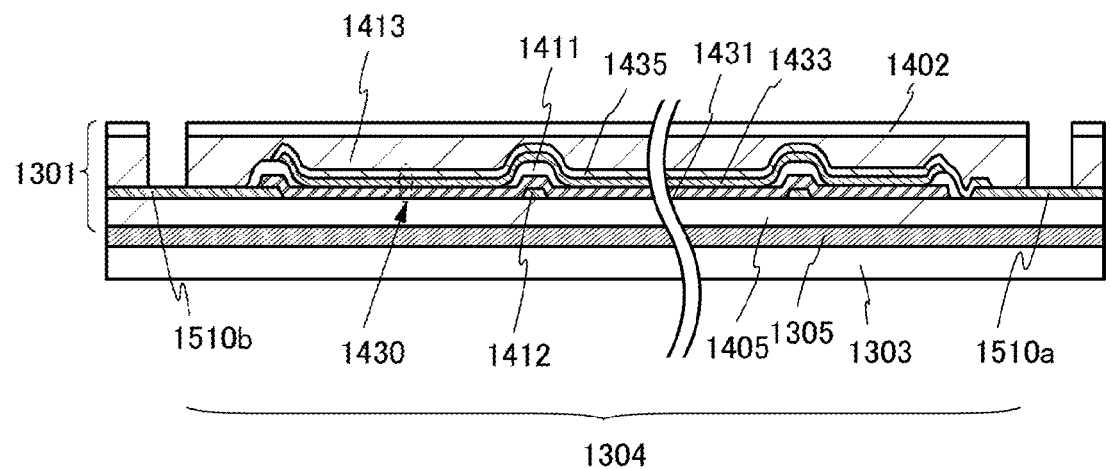

FIG. 11B shows another example of the light-emitting panel.

The light-emitting panel shown in FIG. 11B includes an element layer 1301, a bonding layer 1305, and a substrate 1303. The element layer 1301 includes a substrate 1402, an insulating layer 1405, a conductive layer 1510a, a conductive layer 1510b, a plurality of light-emitting elements, an insulating layer 1411, a conductive layer 1412, and a sealing layer 1413.

The conductive layer 1510a and the conductive layer 1510b, which are external connection electrodes of the light-emitting panel, can each be electrically connected to an FPC or the like.

A light-emitting element 1430 includes a lower electrode 1431, an EL layer 1433, and an upper electrode 1435. An end portion of the lower electrode 1431 is covered with the insulating layer 1411. The light-emitting element 1430 has a bottom emission structure. The lower electrode 1431 has a light-transmitting property and transmits light emitted from the EL layer 1433. The conductive layer 1412 is electrically connected to the lower electrode 1431.

The substrate 1303 may have, as a light extraction structure, a hemispherical lens, a micro lens array, a film provided with an uneven surface structure, a light diffusing film, or the like. For example, a light extraction structure can be formed by attaching the above lens or film to a resin substrate with an adhesive or the like having substantially the same refractive index as the substrate or the lens or film.

The conductive layer 1412 is preferably though not necessarily provided because voltage drop due to the resistance of the lower electrode 1431 can be prevented. The conductive layer 1412 can be a single layer or a stacked layer formed using a material selected from copper, titanium, tantalum, tungsten, molybdenum, chromium, neodymium, scandium, nickel, or aluminum, or an alloy material containing any of these materials as its main component. The thickness of the conductive layer 1412 can be greater than or equal to 0.1 μm and less than or equal to 3 μm, preferably greater than or equal to 0.1 μm and less than or equal to 0.5 μm.

In addition, for a similar purpose, a conductive layer electrically connected to the upper electrode 1435 may be provided over the insulating layer 1411. With this structure, voltage drop due to the resistance of the upper electrode 1435 can be prevented. When a paste (e.g., silver paste) is used as a material for the conductive layer electrically connected to the upper electrode 1435, metal particles forming the conductive layer aggregate; therefore, the surface of the conductive layer is rough and has many gaps. Thus, it is difficult for the EL layer 1433 to completely cover the conductive layer; accordingly, the upper electrode and the conductive layer are electrically connected to each other easily, which is preferable.

<Examples of Materials>

Next, materials and the like that can be used for a light-emitting panel are described. Note that description on the components already described in this embodiment is omitted.

The element layer 1301 includes at least a light-emitting element. As the light-emitting element, a self-luminous element can be used, and an element whose luminance is controlled by current or voltage is included in the category of the light-emitting element. For example, a light-emitting diode (LED), an organic EL element, an inorganic EL element, or the like can be used.

The element layer 1301 may further include a transistor for driving the light-emitting element, a touch sensor, or the like.

The structure of the transistors in the light-emitting panel is not particularly limited. For example, a forward staggered transistor or an inverted staggered transistor may be used. Further, a top-gate transistor or a bottom-gate transistor may be used. A semiconductor material used for the transistors is not particularly limited, and for example, silicon or germanium can be used. Alternatively, an oxide semiconductor containing at least one of indium, gallium, and zinc, such as an In—Ga—Zn-based metal oxide, may be used.

There is no particular limitation on the condition of a semiconductor material used for the transistors, and an amorphous semiconductor or a semiconductor having crystallinity (a microcrystalline semiconductor, a polycrystalline semiconductor, a single-crystal semiconductor, or a semiconductor partly including crystal regions) may be used. Specifically, it is preferable that a semiconductor having crystallinity be used, in which case deterioration of the transistor characteristics can be suppressed.

The light-emitting element included in the light-emitting panel includes a pair of electrodes (the lower electrode 1431 and the upper electrode 1435), and the EL layer 1433 between the pair of electrodes. One of the pair of electrodes functions as an anode and the other functions as a cathode.

The light-emitting element may have any of a top emission structure, a bottom emission structure, and a dual emission structure. A conductive film that transmits visible light is used as the electrode through which light is extracted. A conductive film that reflects visible light is preferably used as the electrode through which light is not extracted.

The conductive film that transmits visible light can be formed using, for example, indium oxide, indium tin oxide (ITO), indium zinc oxide, zinc oxide, or zinc oxide to which gallium is added. Alternatively, a film of a metal material such as gold, silver, platinum, magnesium, nickel, tungsten, chromium, molybdenum, iron, cobalt, copper, palladium, or titanium; an alloy containing any of these metal materials; or a nitride of any of these metal materials (e.g., titanium nitride) can be formed thin so as to have a light-transmitting property. Alternatively, a stack of any of the above materials can be used as the conductive layer. For example, a stacked film of ITO and an alloy of silver and magnesium is preferably used, in which case conductivity can be increased. Further alternatively, graphene or the like may be used.

For the conductive film that reflects visible light, for example, a metal material such as aluminum, gold, platinum, silver, nickel, tungsten, chromium, molybdenum, iron, cobalt, copper, or palladium or an alloy containing any of these metal materials can be used. Lanthanum, neodymium, germanium, or the like may be added to the metal material or the alloy. Furthermore, an alloy containing aluminum (an aluminum alloy) such as an alloy of aluminum and titanium, an alloy of aluminum and nickel, or an alloy of aluminum and neodymium; or an alloy containing silver such as an alloy of silver and copper, an alloy of silver, copper, and palladium, or an alloy of silver and magnesium can be used for the conductive film. An alloy of silver and copper is preferable because of its high heat resistance. Further, by stacking a metal film or a metal oxide film in contact with an aluminum alloy film, oxidation of the aluminum alloy film can be suppressed. Examples of a material for the metal film or the metal oxide film are titanium and titanium oxide. Alternatively, the conductive film having a property of transmitting visible light and a film containing any of the above metal materials may be stacked. For example, a stacked film of silver and ITO or a stacked film of an alloy of silver and magnesium and ITO can be used.

Each of the electrodes may be formed by an evaporation method or a sputtering method. A discharging method such as an ink-jet method, a printing method such as a screen printing method, or a plating method may also be used.

When a voltage higher than the threshold voltage of the light-emitting element is applied between the lower electrode 1431 and the upper electrode 1435, holes are injected to the EL layer 1433 from the anode side and electrons are injected to the EL layer 1433 from the cathode side. The injected electrons and holes are recombined in the EL layer 1433 and a light-emitting material contained in the EL layer 1433 emits light.

The EL layer 1433 includes at least a light-emitting layer. In addition to the light-emitting layer, the EL layer 1433 may further include one or more layers containing any of a substance with a high hole-injection property, a substance with a high hole-transport property, a hole-blocking material, a substance with a high electron-transport property, a substance with a high electron-injection property, a substance with a bipolar property (a substance with a high electron-transport property and a high hole-transport property), and the like.

For the EL layer 1433, either a low molecular compound or a high molecular compound can be used, and an inorganic compound may also be contained. Each of the layers included in the EL layer 1433 can be formed by any of the following methods: an evaporation method (including a vacuum evaporation method), a transfer method, a printing method, an ink-jet method, a coating method, and the like.

In the element layer 1301, the light-emitting element is preferably provided between a pair of insulating films with low water permeability. In this way, an impurity such as water can be prevented from entering the light-emitting element, leading to prevention of a decrease in the reliability of the light-emitting device.

As an insulating film with low water permeability, a film containing nitrogen and silicon (e.g., a silicon nitride film or a silicon nitride oxide film), a film containing nitrogen and aluminum (e.g., an aluminum nitride film), or the like can be used. Alternatively, a silicon oxide film, a silicon oxynitride film, an aluminum oxide film, or the like can be used.

For example, the water vapor transmittance of the insulating film with low water permeability is lower than or equal to $1 \times 10^{-5}$ [g/m$^2$·day], preferably lower than or equal to $1 \times 10^{-6}$ [g/m$^2$·day], further preferably lower than or equal to $1 \times 10^{-7}$ [g/m$^2$·day], still further preferably lower than or equal to $1 \times 10^{-8}$ [g/m$^2$·day].

The substrate 1303 has a light-transmitting property and transmits at least light emitted from the light-emitting element included in the element layer 1301. The substrate 1303 has flexibility. The refractive index of the substrate 1303 is higher than that of the air.

An organic resin, which is lightweight than glass, is preferably used for the substrate 1303, in which case the light-emitting device can be more lightweight as compared to the case where glass is used.

Examples of a material having flexibility and a light-transmitting property with respect to visible light include glass that is thin enough to have flexibility, polyester resins such as polyethylene terephthalate (PET) and polyethylene naphthalate (PEN), a polyacrylonitrile resin, a polyimide resin, a poly(methyl methacrylate) resin, a polycarbonate (PC) resin, a polyethersulfone (PES) resin, a polyamide resin, a cycloolefin resin, a polystyrene resin, a polyamide imide resin, and a polyvinyl chloride resin. In particular, a material whose thermal expansion coefficient is low is preferred, and for example, a polyamide imide resin, a polyimide resin, or PET can be suitably used. A substrate in which a glass fiber is impregnated with an organic resin or a substrate whose thermal expansion coefficient is reduced by mixing an organic resin with an inorganic filler can also be used.

The substrate 1303 may have a stacked structure in which a hard coat layer (such as a silicon nitride layer) by which a surface of a light-emitting device is protected from damage, a layer (such as an aramid resin layer) which can disperse pressure, or the like is stacked over a layer of any of the above-mentioned materials. Furthermore, to suppress a decrease in the lifetime of the light-emitting element due to moisture and the like, the insulating film with low water permeability may be included in the stacked structure.

The bonding layer 1305 has a light-transmitting property and transmits at least light emitted from the light-emitting element included in the element layer 1301. Moreover, the refractive index of the bonding layer 1305 is higher than that of the air.

For the bonding layer 1305, a resin that is curable at room temperature such as a two-component type resin, a light-curable resin, a heat-curable resin, or the like can be used. The examples include an epoxy resin, an acrylic resin, a silicone resin, a phenol resin, and the like. In particular, a material with low moisture permeability, such as an epoxy resin, is preferred.

Furthermore, the resin may include a drying agent. For example, a substance that adsorbs moisture by chemical adsorption, such as oxide of an alkaline earth metal (e.g., calcium oxide or barium oxide), can be used. Alternatively, a substance that adsorbs moisture by physical adsorption, such as zeolite or silica gel, may be used. The drying agent is preferably included because it can prevent an impurity such as moisture from entering the light-emitting element, thereby improving the reliability of the light-emitting device.

In addition, it is preferable to mix a filler with a high refractive index (e.g., titanium oxide) into the resin, in which case the efficiency of light extraction from the light-emitting element can be improved.

The bonding layer 1305 may also include a scattering member for scattering light. For example, the bonding layer 1305 can be a mixture of the above resin and particles having a refractive index different from that of the resin. The particles function as the scattering member for scattering light.

The difference in refractive index between the resin and the particles with a refractive index different from that of the resin is preferably 0.1 or more, further preferably 0.3 or more. Specifically, an epoxy resin, an acrylic resin, an imide resin, silicone, or the like can be used as the resin, and titanium oxide, barium oxide, zeolite, or the like can be used as the particles.

Particles of titanium oxide or barium oxide are preferable because they scatter light excellently. When zeolite is used, it can adsorb water contained in the resin and the like, thereby improving the reliability of the light-emitting element.

For the insulating layer 1405 and the insulating layer 1455, an inorganic insulating material can be used. It is particularly preferable to use the insulating film with low water permeability, in which case a highly reliable light-emitting panel can be provided.

The insulating layer 1407 has an effect of preventing diffusion of impurities into the semiconductor included in the transistor. As the insulating layer 1407, an inorganic insulating film such as a silicon oxide film, a silicon oxynitride film, or an aluminum oxide film can be used.

As each of the insulating layers 1409, 1409a, and 1409b, an insulating film with a planarization function is preferably selected in order to reduce surface unevenness due to the transistor or the like. For example, an organic material such as a polyimide resin, an acrylic resin, or a benzocyclobutene-based resin can be used. As an alternative to such an organic material, a low-dielectric constant material (a low-k material) or the like can be used. Note that a plurality of insulating films formed of these materials or inorganic insulating films may be stacked.

The insulating layer 1411 is formed so as to cover an end portion of the lower electrode 1431. In order that the insulating layer 1411 be favorably covered with the EL layer 1433 and the upper electrode 1435 formed thereover, a side wall of the insulating layer 1411 preferably has a tilted surface with continuous curvature.

As a material of the insulating layer 1411, a resin or an inorganic insulating material can be used. As the resin, for example, a polyimide resin, a polyamide resin, an acrylic resin, a siloxane resin, an epoxy resin, or a phenol resin can be used. In particular, either a negative photosensitive resin or a positive photosensitive resin is preferably used for easy formation of the insulating layer 1411.

There is no particular limitation on the method for forming the insulating layer 1411; a photolithography method, a sputtering method, an evaporation method, a droplet discharging method (e.g., an inkjet method), a printing method (e.g., a screen printing method or an off-set printing method), or the like may be used.

For the sealing layer 1413, a resin that is curable at room temperature such as a two-component type resin, a light-curable resin, a heat-curable resin, or the like can be used. For example, a polyvinyl chloride (PVC) resin, an acrylic resin, a polyimide resin, an epoxy resin, a silicone resin, a polyvinyl butyral (PVB) resin, an ethylene vinyl acetate (EVA) resin, or the like can be used. A drying agent may be contained in the sealing layer 1413. In the case where light emitted from the light-emitting element 1430 is extracted outside through the sealing layer 1413, the sealing layer 1413 preferably includes a filler with a high refractive index or a scattering member. Materials for the drying agent, the filler with a high refractive index, and the scattering member are similar to those which can be used for the bonding layer 1305.

The conductive layer 1357 can be formed using the same material and the same step as a conductive layer included in the transistor or the light-emitting element. For example, the conductive layers each can be formed to have a single-layer structure or a stacked-layer structure using any of metal materials such as molybdenum, titanium, chromium, tantalum, tungsten, aluminum, copper, neodymium, and scandium, or an alloy material containing any of these elements. The conductive layers each may be formed using a conductive metal oxide. As the conductive metal oxide, indium oxide (e.g., $In_2O_3$), tin oxide (e.g., $SnO_2$), zinc oxide (ZnO), indium tin oxide (ITO), indium zinc oxide (e.g., $In_2O_3$—ZnO), or any of these metal oxide materials in which silicon oxide is contained can be used.

Each of the conductive layers 1408, 1412, 1510a, and 1510b can also be formed using any of the above metal materials, alloy materials, and conductive metal oxides.

For the connector 1415, it is possible to use a paste-like or sheet-like material which is obtained by mixture of metal particles and a heat-curable resin and for which anisotropic electric conductivity is provided by thermocompression bonding. As the metal particles, particles in which two or more kinds of metals are layered, for example, nickel particles coated with gold are preferably used.

The coloring layer 1459 is a colored layer that transmits light in a specific wavelength range. For example, a red (R) color filter for transmitting light in a red wavelength range, a green (G) color filter for transmitting light in a green wavelength range, a blue (B) color filter for transmitting light in a blue wavelength range, or the like can be used. Each coloring layer is formed in a desired position with any of various materials by a printing method, an inkjet method, an etching method using a photolithography method, or the like.

The light-blocking layer 1457 is provided between the adjacent coloring layers 1459. The light-blocking layer 1457 blocks light emitted from the adjacent light-emitting element, thereby preventing color mixture between adjacent pixels. Here, the coloring layer 1459 is provided such that its end portion overlaps with the light-blocking layer 1457, whereby light leakage can be reduced. The light-blocking layer 1457 can be formed using a material that blocks light emitted from the light-emitting element, for example, a metal material, a resin material including a pigment or a dye, or the like. Note that the light-blocking layer 1457 is preferably provided in a region other than the light extraction portion 1304, such as the driver circuit portion 1306, as illustrated in FIG. 10B in which case undesired leakage of guided light or the like can be prevented.

The insulating layer 1461 covering the coloring layer 1459 and the light-blocking layer 1457 is preferably provided because it can prevent an impurity such as a pigment included in the coloring layer 1459 or the light-blocking layer 1457 from diffusing into the light-emitting element or the like. For the insulating layer 1461, a light-transmitting material is used, and an inorganic insulating material or an organic insulating material can be used. The insulating film with low water permeability may be used for the insulating layer 1461.

<Manufacturing Method Example>

Next, an example of a method for manufacturing a light-emitting panel will be described with reference to FIGS. 12A to 12C and FIGS. 13A to 13C. Here, the manufacturing method is described using the light-emitting panel of Specific Example 1 (FIG. 10B) as an example.

First, a separation layer 1503 is formed over a formation substrate 1501, and the insulating layer 1405 is formed over the separation layer 1503. Next, the plurality of transistors, the conductive layer 1357, the insulating layer 1407, the insulating layer 1409, the plurality of light-emitting elements, and the insulating layer 1411 are formed over the insulating layer 1405. An opening is formed in the insulating layers 1411, 1409, and 1407 to expose the conductive layer 1357 (see FIG. 12A).

In addition, a separation layer 1507 is formed over a formation substrate 1505, and the insulating layer 1455 is formed over the separation layer 1507. Next, the light-blocking layer 1457, the coloring layer 1459, and the insulating layer 1461 are formed over the insulating layer 1455 (see FIG. 12B).

The formation substrate 1501 and the formation substrate 1505 can each be a hard substrate such as a glass substrate, a quartz substrate, a sapphire substrate, a ceramic substrate, or a metal substrate.

For the glass substrate, for example, a glass material such as aluminosilicate glass, aluminoborosilicate glass, or barium borosilicate glass can be used. In the case where the temperature of the heat treatment performed later is high, a substrate having a strain point of 730° C. or higher is preferably used as the glass substrate. Alternatively crystallized glass or the like may be used.

In the case where a glass substrate is used as the formation substrate, an insulating film such as a silicon oxide film, a silicon oxynitride film, a silicon nitride film, or a silicon nitride oxide film is preferably formed between the formation substrate and the separation layer, in which case contamination from the glass substrate can be prevented.

The separation layer 1503 and the separation layer 1507 each have a single-layer structure or a stacked-layer structure containing an element selected from tungsten, molybdenum, titanium, tantalum, niobium, nickel, cobalt, zirconium, zinc, ruthenium, rhodium, palladium, osmium, iridium, and silicon; an alloy material containing any of the elements; or a compound material containing any of the elements. A crystal structure of a layer containing silicon may be any of amorphous, microcrystal, and polycrystal.

The separation layer can be formed by a sputtering method, a plasma CVD method, a coating method, a printing method, or the like. Note that a coating method includes a spin coating method, a droplet discharge method, and a dispensing method.

In the case where the separation layer has a single-layer structure, a tungsten layer, a molybdenum layer, or a layer containing a mixture of tungsten and molybdenum is preferably formed. Alternatively, a layer containing an oxide or an oxynitride of tungsten, a layer containing an oxide or an oxynitride of molybdenum, or a layer containing an oxide or an oxynitride of a mixture of tungsten and molybdenum may be formed. Note that a mixture of tungsten and molybdenum is an alloy of tungsten and molybdenum, for example.

In the case where the separation layer is formed to have a stacked-layer structure including a layer containing tungsten and a layer containing an oxide of tungsten, the layer containing an oxide of tungsten may be formed as follows: the layer containing tungsten is formed first and an insulating film formed of an oxide is formed thereover, so that the layer containing an oxide of tungsten is formed at the interface between the tungsten layer and the insulating film. Alternatively the layer containing an oxide of tungsten may be formed by performing thermal oxidation treatment, oxygen plasma treatment, nitrous oxide ($N_2O$) plasma treatment, treatment with a highly oxidizing solution such as ozone water, or the like on the surface of the layer containing tungsten. Plasma treatment or heat treatment may be performed in an atmosphere of oxygen, nitrogen, or nitrous oxide alone, or a mixed gas of any of these gasses and another gas. Surface condition of the separation layer is changed by the plasma treatment or heat treatment, whereby adhesion between the separation layer and the insulating film formed later can be controlled.

Note that the insulating layer preferably has a single-layer structure or a stacked-layer structure including any of a silicon nitride film, a silicon oxynitride film, a silicon nitride oxide film, and the like.

Each of the insulating layers can be formed by a sputtering method, a plasma CVD method, a coating method, a printing method, or the like. For example, the insulating layer is formed at a temperature of higher than or equal to 250° C. and lower than or equal to 400° C. by a plasma CVD method, whereby the insulating layer can be a dense film with very low water permeability.

Figure 12A:
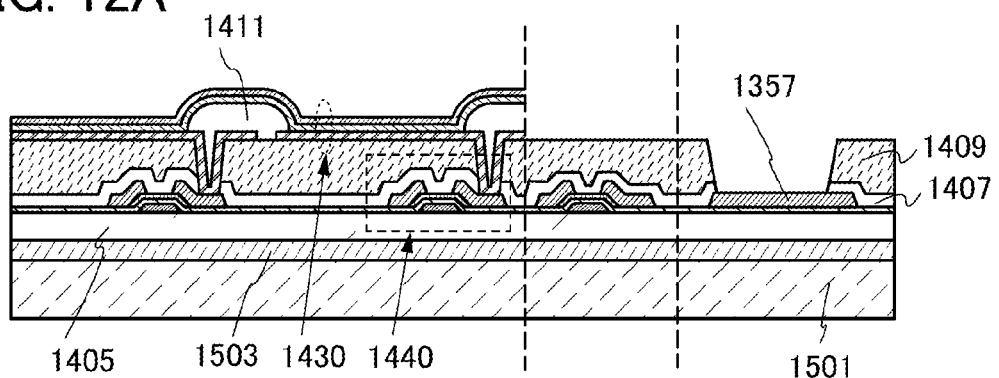
FIGS. 12A to 12C illustrate a method for manufacturing a light-emitting panel according to one embodiment.
Figure 12B:
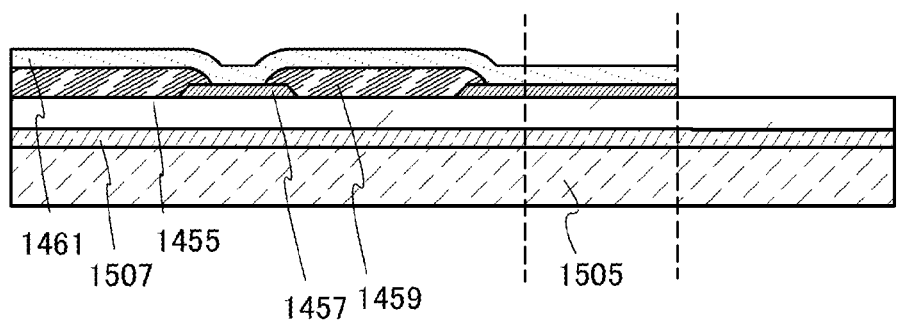
Figure 12C:
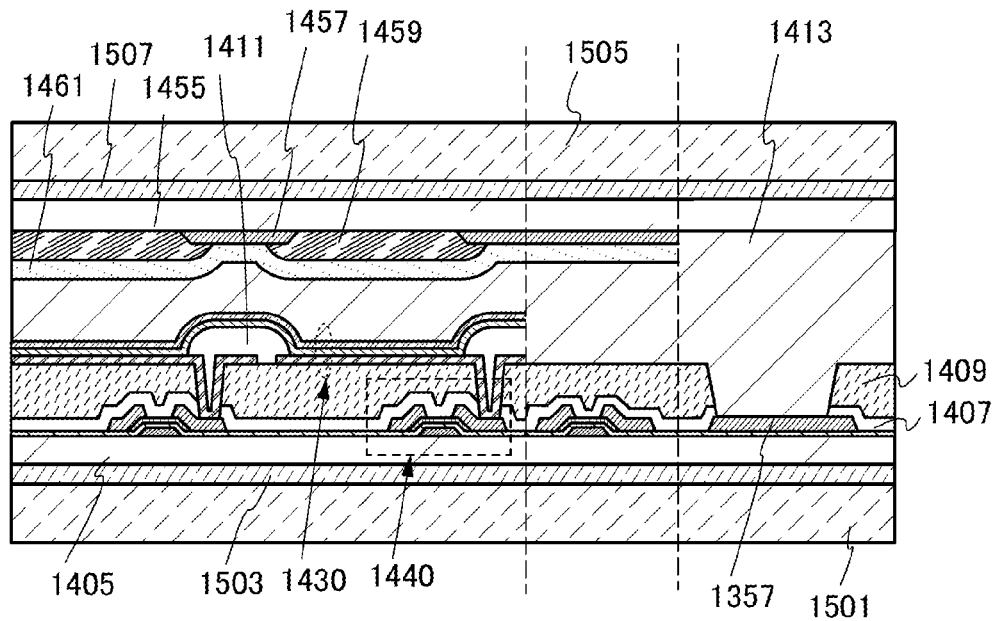

Then, a material for the sealing layer 1413 is applied to a surface of the formation substrate 1505 over which the coloring layer 1459 and the like are formed or a surface of the formation substrate 1501 over which the light-emitting element 1430 and the like are formed, and the formation substrate 1501 and the formation substrate 1505 are attached with the sealing layer 1413 positioned therebetween (see FIG. 12C).

Next, the formation substrate 1501 is separated, and the exposed insulating layer 1405 and the substrate 1401 are attached to each other with the bonding layer 1403. Further, the formation substrate 1505 is separated, and the exposed insulating layer 1455 and the substrate 1303 are attached to each other with the bonding layer 1305. Although the substrate 1303 does not overlap with the conductive layer 1357 in FIG. 13A, the substrate 1303 may overlap with the conductive layer 1357.

Note that a variety of separation methods can be used for separation of the formation substrate in the separation process of one embodiment of the present invention. For example, when a layer including a metal oxide film is formed as the separation layer on the side in contact with the layer to be separated, the metal oxide film is embrittled by crystallization, whereby the layer to be separated can be separated from the formation substrate. Alternatively, when an amorphous silicon film containing hydrogen is formed as the separation layer between the formation substrate having high heat resistance and the layer to be separated, the amorphous silicon film is removed by laser light irradiation or etching, whereby the layer to be separated can be separated from the formation substrate. Alternatively, after a layer including a metal oxide film is formed as the separation layer on the side in contact with the layer to be separated, the metal oxide film is embrittled by crystallization, and part of the separation layer is removed by etching using a solution or a fluoride gas such as $NF_3$, $BrF_3$, or $ClF_3$, whereby the separation can be performed at the embrittled metal oxide film. Further alternatively, a method carried out as follows may be employed: a film containing nitrogen, oxygen, hydrogen, or the like (e.g., an amorphous silicon film containing hydrogen, an alloy film containing hydrogen, an alloy film containing oxygen, or the like) is used as the separation layer, and the separation layer is irradiated with laser light to release the nitrogen, oxygen, or hydrogen contained in the separation layer as gas, thereby promoting separation between the layer to be separated and the formation substrate. Alternatively, it is possible to use a method in which the formation substrate provided with the layer to be separated is removed mechanically or by etching using a solution or a fluoride gas such as $NF_3$, $BrF_3$, or $ClF_3$, or the like. In this case, the separation layer is not necessarily provided.

When a plurality of the above-described separation methods is combined, the separation process can be conducted easily. In other words, separation can be performed with physical force (by a machine or the like) after performing laser light irradiation, etching on the separation layer with a gas, a solution, or the like, or mechanical removal with a sharp knife, scalpel or the like so that the separation layer and the layer to be separated can be easily separated from each other. This process corresponds to the step of forming a separation starting point in this specification. The separation starting point is preferably formed in each of the processed member and the stack which are processed with a stack manufacturing apparatus of one embodiment of the present invention.

Separation of the layer to be separated from the formation substrate may be carried out by soaking the interface between the separation layer and the layer to be separated in a liquid. Further, the separation may be conducted while a liquid such as water is being poured.

As another separation method, in the case where the separation layer is formed using tungsten, it is preferable that the separation be performed while etching the separation layer using a mixed solution of ammonium water and a hydrogen peroxide solution.

Note that the separation layer is not necessarily provided in the case where separation at an interface between the formation substrate and the layer to be separated is possible. For example, glass is used as the formation substrate, an organic resin such as polyimide is formed in contact with the glass, and an insulating film, a transistor, and the like are formed over the organic resin. In this case, heating the organic resin enables the separation at the interface between the formation substrate and the organic resin. Alternatively, separation at the interface between a metal layer and the organic resin may be performed in the following manner: the metal layer is provided between the formation substrate and the organic resin and current is made to flow in the metal layer so that the metal layer is heated.

Figure 13A:
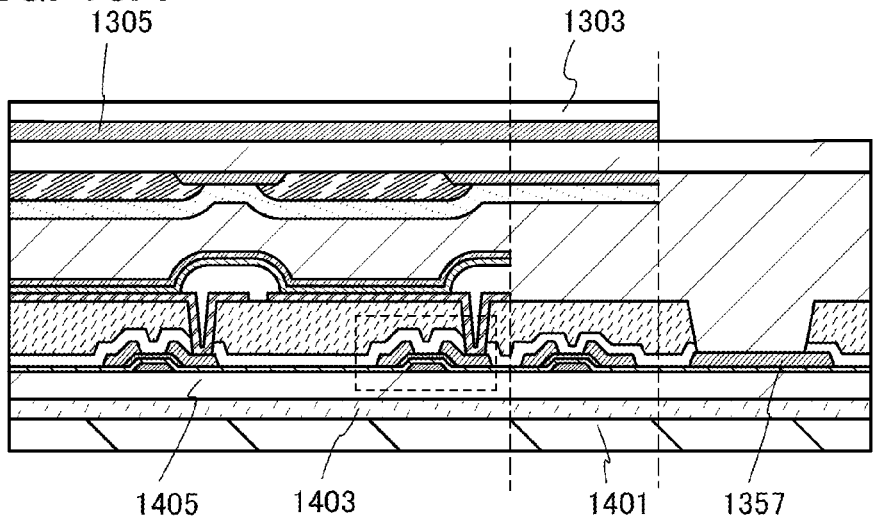
FIGS. 13A to 13C illustrate a method for manufacturing a light-emitting panel according to one embodiment.
Figure 13B:
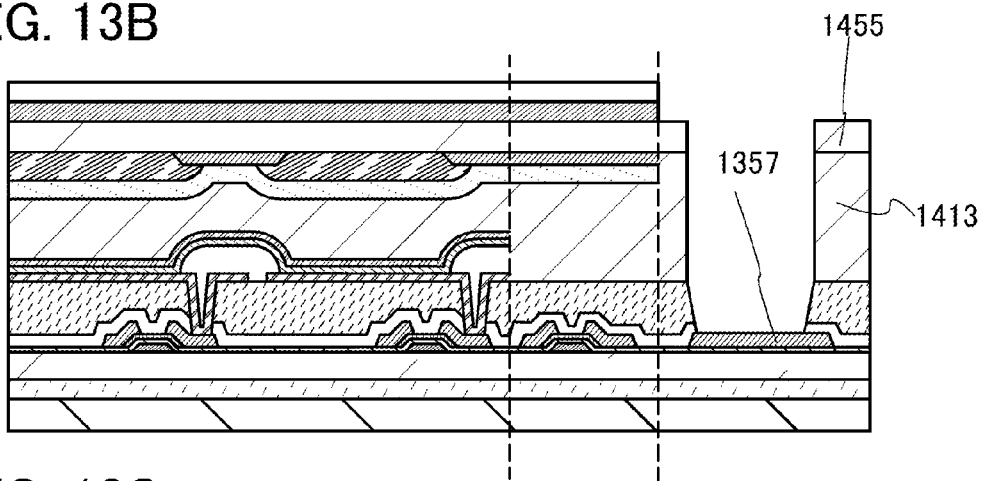
Figure 13C:
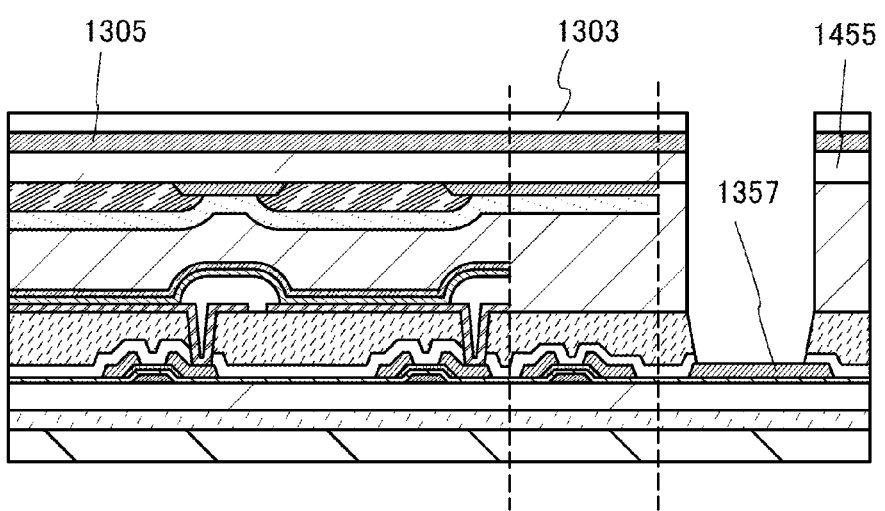

Lastly, an opening is formed in the insulating layer 1455 and the sealing layer 1413 to expose the conductive layer 1357 (see FIG. 13B). In the case where the substrate 1303 overlaps with the conductive layer 1357, the opening is formed also in the substrate 1303 and the bonding layer 1305 (see FIG. 13C). The method for forming the opening is not particularly limited and may be, for example, a laser ablation method, an etching method, an ion beam sputtering method, or the like. As another method, a cut may be made in a film over the conductive layer 1357 with a sharp knife or the like and part of the film may be separated by physical force.

In the above-described manner, the light-emitting panel can be manufactured.

Figure 15:
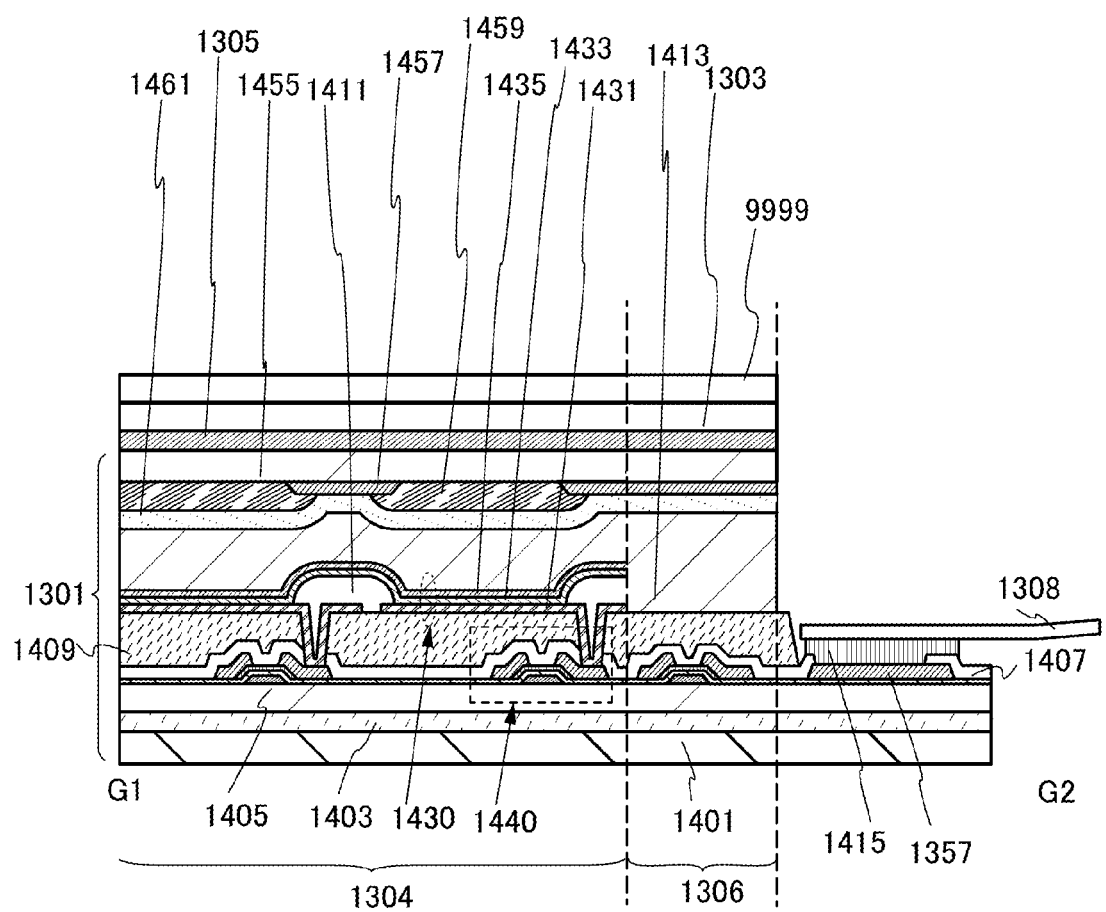
FIG. 15 illustrates a light-emitting panel according to one embodiment.

Note that the light-emitting panel may be provided with a touch sensor or a touch panel. An example in which the light-emitting panel of FIGS. 10A and 10B is provided with a touch panel 9999 is shown in FIG. 15. Note that the touch sensor may be directly formed over the substrate 1303, or the touch panel 9999 formed over another substrate may be placed over the substrate 1303.

Note that although the case where the light-emitting element is used as a display element is described here, one embodiment of the present invention is not limited thereto, and a variety of display elements can be used. For example, in this specification and the like, a display element, a display device, which is a device having a display element, a light-emitting element, and a light-emitting device, which is a device having a light-emitting element, can employ various modes or can have various elements. Examples of a display element, a display device, a light-emitting element, or a light-emitting device include a display medium whose contrast, luminance, reflectance, transmittance, or the like is changed by electromagnetic action, such as an electroluminescence (EL) element (e.g., an EL element including organic and inorganic materials, an organic EL element, or an inorganic EL element), an LED (e.g., a white LED, a red LED, a green LED, or a blue LED), a transistor (a transistor that emits light depending on current), an electron emitter, a liquid crystal element, electronic ink, an electrophoretic element, a grating light valve (GLV), a plasma display panel (PDP), a micro electro mechanical system (MEMS), a digital micromirror device (DMD), a digital micro shutter (DMS), interferometric modulator display (IMOD) element, an electrowetting element, a piezoelectric ceramic display, or a carbon nanotube. Examples of a display device using an EL element include an EL display. Examples of a display device using an electron emitter include a field emission display (FED), an SED-type flat panel display (SED: surface-conduction electron-emitter display), and the like. Examples of a display device using a liquid crystal element include a liquid crystal display (e.g., a transmissive liquid crystal display, a transflective liquid crystal display, a reflective liquid crystal display, a direct-view liquid crystal display, or a projection liquid crystal display). Examples of a display device using electronic ink or electrophoretic elements include electronic paper.

In this specification and the like, an active matrix method in which an active element is included in a pixel or a passive matrix method in which an active element is not included in a pixel can be used.

In an active matrix method, as an active element (a non-linear element), not only a transistor but also various active elements (non-linear elements) can be used. For example, an MIM (metal insulator metal), a TFD (thin film diode), or the like can also be used. Since the number of manufacturing steps required for these elements is small, manufacturing cost can be reduced or yield can be improved. Also, since the size of these elements are small, the aperture ratio can be improved, so that power consumption can be reduced or higher luminance can be achieved.

As a method other than the active matrix method, the passive matrix method in which an active element (a non-linear element) is not used can also be used. Since an active element (a non-linear element) is not used, the number of manufacturing steps is small, so that manufacturing cost can be reduced or yield can be improved. Also, since an active element (a non-linear element) is not used, the aperture ratio can be improved, so that power consumption can be reduced or higher luminance can be achieved, for example.

As described above, a light-emitting panel of this embodiment is formed using two substrates; one is the substrate 1303 and the other is the substrate 1401. The light-emitting panel can be formed using two substrates even when including a touch sensor. Owing to the use of the minimum number of substrates, improvement in light extraction efficiency and improvement in clarity of display can be easily achieved.

As examples of electronic appliances using a display device with flexibility, the following can be given: television devices (also referred to as televisions or television receivers), monitors of computers or the like, cameras such as digital cameras or digital video cameras, digital photo frames, mobile phones (also referred to as cellular phones or cellular phone devices), portable game machines, portable information terminals, audio reproducing devices, large game machines such as pachinko machines, and the like.

In addition, a lighting device or a display device can be incorporated in a curved inside/outside wall surface of a house or a building, or a curved interior/exterior surface of a car.

This embodiment can be combined with descriptions in this specification such as another embodiment.

This application is based on Japanese Patent Application serial no. 2013-193377 filed with Japan Patent Office on Sep. 18, 2013, the entire contents of which are hereby incorporated by reference.

What is claimed is:

1. A display device comprising:
   a sensing unit configured to sense positional information of the display device; and
   a display portion configured to display an information on a display surface and an image in a display position on the display surface at the same time, the display position being determined in accordance with the positional information,
   wherein the display device has a curved shape,
   wherein the positional information comprises rotational positional information based on rotation in a circumferential direction of the display device, and
   wherein the display position is configured to move, in a direction opposite to the circumferential direction, a length of $r\theta$ (product of r and $\theta$) where r is a radius of the display device and $\theta$ radian is an angle of rotation in the circumferential direction of the display device.

2. The display device according to claim 1, wherein the sensing unit comprises an acceleration sensor.

3. The display device according to claim 1, wherein the display position is configured to move in a direction opposite to the rotation in the circumferential direction.

4. The display device according to claim 1, wherein the display surface of the display portion exists in a range of larger than 180° and smaller than or equal to 360° along a circumferential direction of the display device.

5. The display device according to claim 1, wherein the display device is a wearable display device.

6. A driving method of a display device, comprising:
   sensing displacement of a curved-shaped display device;
   determining a display position in accordance with the displacement; and
   displaying an information on a display surface and an image in the display position on the display surface at the same time, wherein the displacement comprises rotational displacement based on rotation in a circumferential direction of the display device, and wherein the display position is configured to move, in a direction opposite to the circumferential direction, a length of $r\theta$ (product of r and $\theta$) where r is a radius of the display device and $\theta$ radian is an angle of rotation in the circumferential direction of the display device.

7. The driving method of a display device according to claim 6, wherein the displacement is sensed by an acceleration sensor.

8. The driving method of a display device according to claim 6, wherein the display position is configured to move in a direction opposite to the rotation in the circumferential direction.

9. The driving method of a display device according to claim 6, wherein the display surface configured to display the image exists in a range of larger than 180° and smaller than or equal to 360° along a circumferential direction of the display device.

10. A non-transitory computer-readable memory medium storing a program,
   wherein the program comprises:
   an instruction to sense displacement of a display device;
   an instruction to move a display position of an image in accordance with the displacement; and
   an instruction to display an information on a display surface and the image in the display position on the display surface at the same time,
   wherein the displacement comprises rotational displacement based on rotation in a circumferential direction of the display device, and
   wherein the display position is configured to move, in a direction opposite to the circumferential direction, a length of $r\theta$ (product of r and $\theta$) where r is a radius of the display device and $\theta$ radian is an angle of rotation in the circumferential direction of the display device.

11. The non-transitory computer-readable memory medium according to claim 10, wherein the displacement is sensed by an acceleration sensor.

12. The non-transitory computer-readable memory medium according to claim 10, wherein the display position is configured to move in a direction opposite to the rotation in the circumferential direction.

13. The non-transitory computer-readable memory medium according to claim 10, wherein the display surface configured to display the image exists in a range of larger than 180° and smaller than or equal to 360° along a circumferential direction of the display device.

14. The display device according to claim 1, further comprising:
   a second sensing unit comprising an acceleration sensor, wherein the sensing unit comprises an acceleration sensor.

15. The driving method of a display device according to claim 6, wherein the displacement is sensed by a first acceleration sensor and a second acceleration sensor.

16. The non-transitory computer-readable memory medium according to claim 10, wherein the displacement is sensed by a first acceleration sensor and a second acceleration sensor.

17. The display device according to claim 1, wherein the curved shape is a ring shape.

18. The driving method of a display device according to claim 6, wherein the curved-shaped display device is a ring-shaped display device.

* * * * *